(12) United States Patent
Monro

(10) Patent No.: US 7,843,367 B2
(45) Date of Patent: *Nov. 30, 2010

(54) DATA CODING BUFFER FOR ELECTRICAL COMPUTERS AND DIGITAL DATA PROCESSING SYSTEMS

(76) Inventor: Donald M. Monro, 6, the Lays, Goose Street, Beckington BA11 6RS (GB)

( * ) Notice: Subject to any disclaimer, the term of this patent is extended or adjusted under 35 U.S.C. 154(b) by 0 days.

This patent is subject to a terminal disclaimer.

(21) Appl. No.: 12/463,584

(22) Filed: May 11, 2009

(65) Prior Publication Data

US 2009/0219180 A1 Sep. 3, 2009

Related U.S. Application Data

(63) Continuation of application No. 11/777,144, filed on Jul. 12, 2007, now Pat. No. 7,548,176.

(51) Int. Cl.
H03M 7/02 (2006.01)
(52) U.S. Cl. .............................. 341/83; 341/87; 341/65
(58) Field of Classification Search .................. 341/65, 341/83, 87
See application file for complete search history.

(56) References Cited

U.S. PATENT DOCUMENTS

| | | | |
|---|---|---|---|
| 3,626,167 A | 12/1971 | Guck et al. | |
| 4,168,513 A | 9/1979 | Hains et al. | |
| 4,509,038 A | 4/1985 | Hirano | |
| 4,792,793 A | 12/1988 | Rawlinson et al. | |
| 5,748,786 A | 5/1998 | Zandi et al. | |
| 5,754,704 A | 5/1998 | Barnsley et al. | |
| 5,764,803 A * | 6/1998 | Jacquin et al. | 382/236 |
| 5,768,437 A | 6/1998 | Monro | |
| 5,818,877 A * | 10/1998 | Tsai et al. | 375/241 |
| 5,915,044 A * | 6/1999 | Gardos et al. | 382/236 |
| 6,078,619 A | 6/2000 | Monro | |
| 6,272,241 B1 | 8/2001 | Tattersall | |
| 6,373,411 B1 | 4/2002 | Shoham | |
| 6,556,719 B1 | 4/2003 | Monro | |

(Continued)

FOREIGN PATENT DOCUMENTS

EP 0595599 5/1994

(Continued)

OTHER PUBLICATIONS

De Natale et al., "A Mesh-Interpolation Scheme for Very-Low Birate Coding of Video Sequences" European Transactions on Telecommunications, vol. 9, No. 1, pp. 47-55, 1998.

(Continued)

*Primary Examiner*—Jean B Jeanglaude

(57) ABSTRACT

A method includes receiving, at a decoding device, first contents of a buffer, where the first contents of the buffer include at least a first data symbol. The first data symbol is coded into the first contents of the buffer based at least in part on a first radix of the first data symbol. The first data symbol is decoded from the first contents of the buffer. Based at least in part on the first radix of the first data symbol, it is determined whether the first contents of the buffer include a second data symbol. The second data symbol is decoded from the first contents of the buffer if the first contents include the second data symbol.

27 Claims, 8 Drawing Sheets

U.S. PATENT DOCUMENTS

| | | |
|---|---|---|
| 6,990,145 B2 | 1/2006 | Monro |
| 7,015,837 B1 | 3/2006 | Malvar |
| 7,030,789 B1 | 4/2006 | Cideciyan et al. |
| 7,082,483 B2 | 7/2006 | Poo |
| 7,155,445 B1 | 12/2006 | Kling et al. |
| 7,265,691 B2 | 9/2007 | Tomic |
| 7,340,013 B2 | 3/2008 | Ammer et al. |
| 2004/0126018 A1 | 7/2004 | Monro |
| 2004/0165737 A1 | 8/2004 | Monro |
| 2007/0282933 A1 | 12/2007 | Monro |
| 2009/0015441 A1 | 1/2009 | Monro |
| 2009/0015442 A1 | 1/2009 | Monro |
| 2009/0015444 A1 | 1/2009 | Monro |
| 2009/0015445 A1 | 1/2009 | Monro |
| 2009/0016452 A1 | 1/2009 | Monro |
| 2009/0016453 A1 | 1/2009 | Monro |
| 2009/0019069 A1 | 1/2009 | Monro |
| 2009/0019070 A1 | 1/2009 | Monro |
| 2009/0019071 A1 | 1/2009 | Monro |
| 2009/0019128 A1 | 1/2009 | Monro |

FOREIGN PATENT DOCUMENTS

| | | |
|---|---|---|
| EP | 0836325 | 4/1998 |
| EP | 0939554 | 9/1999 |
| GB | 2293733 | 4/1996 |
| WO | WO 97/16029 | 5/1997 |
| WO | WO 99/08449 | 2/1999 |
| WO | WO 01/63935 | 8/2001 |

OTHER PUBLICATIONS

Tian et al., "Image Data Processing in the Compressed Wavelet Domain" Proceedings of ICSP '96, pp. 978-981, 1996.

Said et al., "A New, Fast, and Efficient Image Codec Based on Set Partitioning in Hierarchical Trees" IEEE Transactions on Circuits and Systems for Video Technology, vol. 6, No. 3, pp. 243-250, Jun. 1996.

Shapiro, "Embedded Image Coding Using Zerotrees of Wavelet Coefficients" IEEE Transactions on Signal Processing, vol. 41, No. 12, pp. 3445-3462, Dec. 1993.

Horst et al., "Mupcos: A Multi-Purpose Coding Scheme" Signal Processing: Image Communication 5, pp. 75-89, 1993.

International Search Report and Written Opinion for PCT/US2008/069539 completed Sep. 5, 2008.

International Search Report and Written Opinion for PCT/US2008/069543 completed Sep. 5, 2008.

Communication and Written Opinion for PCT/US2008/069317 mailed Oct. 9, 2008.

Communication and Written Opinion for PCT/US2008/069497 mailed Oct. 9, 2008.

Anonymous: "Conversion Between Different Number Systems" Internet Article, [Online] Nov. 11, 2002, XP002494744. Retrieved from Internet URL: http://www.cstc.org/data/resources/60/convexp.html> [retrieved on Sep. 5, 2008] the whole document.

International Search Report and Written Opinion for PCT/US2008/069502 mailed Nov. 3, 2008.

Bose et al., "Lee Distance Gray Codes", Information Theory, 1995. Proceedings, 1995 IEEE International Symposium on Whistler, BC, Canada Sep. 17-22, 1995, New York, NY, USA, IEEE, US, Sep. 17, 1995.

Rice, R.F., "Some Practical Universal Noiseless Coding Techniques," Jet Propulsion Laboratory, Pasadena, California, JPL Publication 79-22, Mar. 1979.

Notice of Allowance from U.S. Appl. No. 11/776,786, mailed Jun. 17, 2009.

Notice of Allowance for U.S. Appl. No. 11/777,081, mailed Oct. 13, 2009.

Non-final Office Action on U.S. Appl. No. 12/423,935, mailed Jul. 8, 2010.

* cited by examiner

DATA CODING BUFFER FOR ELECTRICAL COMPUTERS AND DIGITAL DATA PROCESSING SYSTEMS

CROSS-REFERENCE TO RELATED PATENT APPLICATIONS

This application is a Continuation of U.S. patent application Ser. No. 11/777,144, filed Jul. 12, 2007, the entire disclosure of which is hereby incorporated by reference.

FIELD

This disclosure is related to data coding, such as, for example, data compression within electrical computers and digital data processing systems. Subject matter disclosed herein may relate to processes or apparatus for transferring data from one or more peripherals to one or more computers or digital data processing systems for the latter to process, store, and/or further transfer and/or for transferring data from the computers or digital data processing systems to the peripherals. Subject matter disclosed herein may relate to processes or apparatus for interconnecting or communicating between two or more components connected to an interconnection medium a within a single computer or digital data processing system. Subject matter disclosed herein may relate to processes or apparatus for transferring data from one computer or digital processing system to another computer or digital processing system via a network or other interconnection medium.

BACKGROUND

Data sharing between portions of a computing platform and/or over networks has become more and more common in recent years. However, bandwidth is typically a limiting factor when sharing data between portions of a computing platform and/or over networks. It may be desirable to code data, such as by data compression prior to transmitting the data between portions of a computing platform and/or over a network. Additionally, for similar reasons it may be desirable to code and/or compress data before storing data on a storage medium. Accordingly, compression may be used, for example, in storing data on magnetic or other media, in transferring data from one component to another within a computing platform, and/or in transferring data to and/or from a peripheral device to and/or from a computing platform.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1:
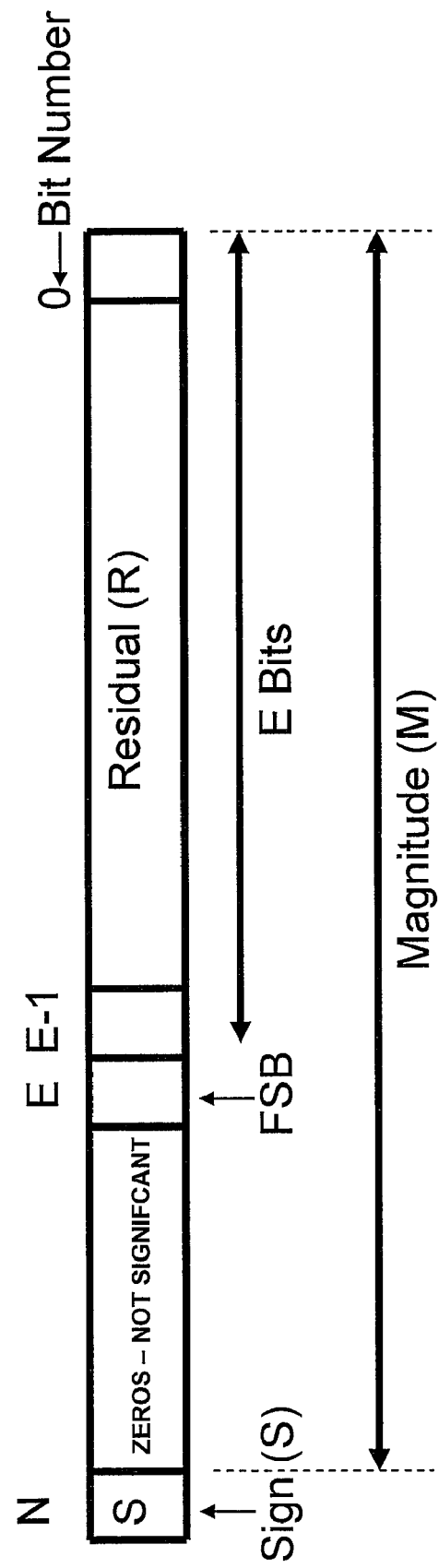
FIG. 1 is a schematic diagram illustrating an example encoded integer in accordance with one or more embodiments.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, and so on, may be used to facilitate the discussion of the drawings and are not intended to restrict the application of claimed subject matter. Therefore, the following detailed description is not to be taken in a limiting sense and the scope of claimed subject matter defined by the appended claims and their equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

Embodiments claimed may include one or more apparatuses for performing the operations herein. These apparatuses may be specially constructed for the desired purposes, or they may comprise a general purpose computing platform selectively activated and/or reconfigured by a program stored in the device. The processes and/or displays presented herein are not inherently related to any particular computing platform and/or other apparatus. Various general purpose computing platforms may be used with programs in accordance with the teachings herein, or it may prove convenient to construct a more specialized computing platform to perform the desired method. The desired structure for a variety of these computing platforms will appear from the description below.

Embodiments claimed may include algorithms, programs and/or symbolic representations of operations on data bits or binary digital signals within a computer memory capable of performing one or more of the operations described herein. Although the scope of claimed subject matter is not limited in this respect, one embodiment may be in hardware, such as implemented to operate on a device or combination of devices, whereas another embodiment may be in software. Likewise, an embodiment may be implemented in firmware, or as any combination of hardware, software, and/or firmware, for example. These algorithmic descriptions and/or representations may include techniques used in the data processing arts to transfer the arrangement of a computing platform, such as a computer, a computing system, an electronic computing device, and/or other information handling system, to operate according to such programs, algorithms, and/or symbolic representations of operations. A program and/or process generally may be considered to be a self-consistent sequence of acts and/or operations leading to a desired result. These include physical manipulations of physical quantities. Usually, though not necessarily, these quantities take the form of electrical and/or magnetic signals capable of being stored, transferred, combined, compared, and/or otherwise manipulated. It has proven convenient at times, principally for reasons of common usage, to refer to these signals as bits, values, elements, symbols, characters, terms, numbers and/or the like. It should be understood, however, that all of these and/or similar terms are to be associated with the appropriate physical quantities and are merely convenient labels applied to these quantities. In addition, embodiments are not described with reference to any particular programming language. It will be appreciated that a variety of programming languages may be used to implement the teachings described herein.

Likewise, although the scope of claimed subject matter is not limited in this respect, one embodiment may comprise one or more articles, such as a storage medium or storage media. This storage media may have stored thereon instructions that when executed by a computing platform, such as a computer, a computing system, an electronic computing device, and/or other information handling system, for example, may result in an embodiment of a method in accordance with claimed subject matter being executed, for example. In the following description and/or claims, the terms "storage medium" and/or "storage media" as referred to herein relate to media capable of maintaining expressions which are perceivable by one or more machines. For example, a storage medium may comprise one or more storage devices for storing machine-readable instructions and/or information. Such storage devices may comprise any one of several media types including, but not limited to, any type of magnetic storage media, optical storage media, semiconductor storage media, disks, floppy disks, optical disks, CD-ROMs, magnetic-optical disks, read-only memories (ROMs), random access memories (RAMs), electrically programmable read-only memories (EPROMs), electrically erasable and/or programmable read-only memories (EEPROMs), flash memory, magnetic and/or optical cards, and/or any other type of media suitable for storing electronic instructions, and/or capable of being coupled to a system bus for a computing platform. However, these are merely examples of a storage medium, and the scope of claimed subject matter is not limited in this respect.

In the following description and/or claims, the term "instructions" as referred to herein relates to expressions which represent one or more logical operations. For example, instructions may be machine-readable by being interpretable by a machine for executing one or more operations on one or more data objects. However, this is merely an example of instructions, and the scope of claimed subject matter is not limited in this respect. In another example, instructions as referred to herein may relate to encoded commands which are executable by a processor having a command set that includes the encoded commands. Such an instruction may be encoded in the form of a machine language understood by the processor. However, these are merely examples of an instruction, and the scope of claimed subject matter is not limited in this respect.

Unless specifically stated otherwise, as apparent from the following discussion, it is appreciated that throughout this specification discussions utilizing terms such as processing, computing, calculating, selecting, forming, enabling, inhibiting, identifying, initiating, receiving, transmitting, determining, displaying, sorting, delivering, appending, making, presenting, distorting and/or the like refer to the actions and/or processes that may be performed by a computing platform, such as a computer, a computing system, an electronic computing device, and/or other information handling system, that manipulates and/or transforms data represented as physical electronic and/or magnetic quantities and/or other physical quantities within the computing platform's processors, memories, registers, and/or other information storage, transmission, reception and/or display devices. Further, unless specifically stated otherwise, processes described herein, with reference to flow diagrams or otherwise, may also be executed and/or controlled, in whole or in part, by such a computing platform.

In the following description and/or claims, the term "and/or" as referrea to herein may mean "and", it may mean "or", it may mean "exclusive-or", it may mean "one", it may mean "some, but not all", it may mean "neither", and/or it may mean "both", although the scope of claimed subject matter is not limited in this respect.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" and/or "an embodiment" in various places throughout this specification are not necessarily all referring to the same embodiment. Furthermore, the particular features, structures, and/or characteristics may be combined in one or more embodiments.

Although claimed subject matter is not so limited, one potential, although not exclusive, application of an embodiment may be in the field of transmitting data to and/or from input/output portions of a computing platform. Data may be transmitted to other portions of a computing platform and/or from a computing platform to another entity, such as a network or additional computing platform. It may be desirable in this particular field, for example, to compress data relatively efficiently prior to transmitting. In this and analogous fields, it may also be desirable to transmit information across an interconnect, such as an interconnect that may be subject to restrictions on the number of bits that may be transmitted, or on the bit transmission rate. Therefore, relatively efficient coding may result in more information being transmitted per unit time, for example. Another application, also previously suggested, may be in the compression of data on an electronic device, such as for storage in files, for example. This may, for example, reduce the amount of memory for storage of the particular data, for example, or, as another example, facilitate transmission of the data by reducing the size of an attachment to an email. Of course, claimed subject matter is not limited to these simple examples. These are provided simply for purposes of illustration.

Likewise, embodiments covered by claimed subject matter include, for example, a computer program capable of implementing any such method, and/or a computing device capable of implementing such a method. Embodiments also include a hardware and/or software based coder capable of carrying out a method as described below in combination with a hardware and/or software decoder capable of reconstructing an original set or grouping of data from a data code representing a compression of such data. These as well as many other embodiments are intended to be within the scope of claimed subject matter.

In at least some embodiments described, data compression may be lossless, although claimed subject matter is not limited in scope in this respect. Furthermore, in this particular context, any grouping, set, block or portion of associated data to be compressed may be treated as an ordered sequence of characters or other symbols. If such data is representative of text, for example, individual symbols may comprise one or more text characters, but that is, of course, not essential. Many other symbols may also be represented. More generally, symbols may be presented by bytes or other sized groupings of data. It is also possible that longer or short portions of data may be used, which may or may not fit within a byte or digital word length, for example. If data is represented in binary form, a symbol may be represented, depending on the particular embodiment, as a single bit or multiple bits of fixed or variable length.

In one embodiment, symbols may comprise any type, form or format of data. For example, the symbol may include items, such as, for example, records, files, sectors, clusters, groupings and/or portions thereof. In this particular context, any grouping, set, block or portion of associated data to be compressed may be treated as an ordered sequence of characters or other symbols. If, in one embodiment, such data is representative of text, for example, individual symbols may comprise one or more text characters, but, of course, the claimed subject mater is not limited in that respect. More generally, in other embodiments, symbols may comprise words, bytes, bits, text, characters and/or the like. However, these are merely a few illustrative examples to which the claimed subject matter is not limited. In one embodiment, symbol strings may comprise single or multiple symbols. Conversely, in other embodiments, they may be fixed or variable in length.

For one particular embodiment, symbol strings may be coded in a particular or a substantially predetermined order, although, again, this is merely an example embodiment and the claimed subject matter is not limited in scope in this respect. Alternatively or in addition, rather than coding in an order, in another embodiment, symbol strings may be coded in any order. In such an embodiment a symbol string code may be prefixed by some other code indicative of the particular symbol string, for example, although the claimed subject matter is of course not limited in scope to this example embodiment. Likewise, for one particular embodiment, the approach employed may be switchable between modes, such as a mode in which symbol string codes are transmitted or stored in a predetermined order, and a mode in which the order is not predetermined, but in which, in this latter mode, some code representative of a corresponding symbol string is sent before or as part of a symbol string code.

Furthermore, in various embodiments, side or additional information about all or some symbol strings may also be included in the compressed data code. In one particular embodiment, additional information relating to a particular symbol string may be sent at the end of or otherwise associated with a corresponding symbol string code. Alternatively, in another embodiment, additional information may be sent or stored after sending or storing symbol string codes. More generally, in various embodiments, additional information may be provided at any time or in any manner so that a decoder may be capable of associating that information with a corresponding symbol string. In one embodiment, a list or table of symbol strings to be used may be predetermined or predefined, for example. Alternatively or in an additional embodiment, it may be compiled based at least in part on symbol strings which occur in data to be compressed, for example. Additionally or alternatively, if a data grouping includes repetitions of a binary symbol, a first binary symbol code may indicate the number of occurrences of the binary symbol within the data, and a second binary symbol code may select which pattern of the possible combinations describes the positions of the binary symbol code within the data, for example.

Furthermore, in various embodiments, after binary symbol codes for a particular set or grouping of data have been stored or transmitted, an Escape (ESC) code may be used. After positions of binary symbols present in a set of data, except a final binary symbol, have been stored or communicated, positions of the final binary symbol may, in at least some embodiments, be determined. Hence, an encoder may omit storing or communicating positions of such a final binary symbol, for example. However in particular circumstances, such as to code sparse or non-uniformly distributed data, the ESC code may be used if the data is sufficiently sparse that many binary symbol groups are empty, i.e. the data contains no instances of particular binary symbol codes, for example.

As described above, data, such as stored as a file, a record or other unitary association of data, as one example, might be treated as a whole, or instead partitioned or divided into convenient lengths, long enough for symbol groupings, referred to here as binary symbols, to be coded with some amount of compression efficiency and/or short enough to be processed conveniently. Various approaches are described in more detail below. Coding may be carried out by a hardware or software coder. In one possible embodiment, a coder may be arranged to transmit data, after being coded, across a communications channel to a decoder which may be arranged, in real time or otherwise, to use received coded data to reconstruct the set of data. Again, claimed subject matter is not limited in scope to a particular embodiment. Therefore, the embodiments described hereinafter are intended simply as examples for purposes of illustration. Many other approaches and/or embodiments are intended to be included within the scope of claimed subject matter other than these specific examples.

Forming an efficient compressed binary code with data from a range of g symbols which have the same probability has not been a straightforward task if g is not a power of 2. Such data might arise in tossing a die of g sides, for example, or in coding a sequence of equally probable combinations such as might arise in a Combinatorial Coder, as described in co-pending U.S. patent application Ser. No. 11/777,256 titled COMBINATORIAL CODING/DECODING FOR ELECTRICAL COMPUTERS AND DIGITAL DATA PROCESSING SYSTEMS, by Donald M. Monro,; U.S. patent application Ser. No. 11/777,239 titled BLOCKING FOR COMBINATORIAL CODING/DECODING FOR ELECTRICAL COMPUTERS AND DIGITAL DATA PROCESSING SYSTEMS, by Donald M. Monro; U.S. patent application Ser. No. 11/777,230 titled BLOCKING FOR COMBINATORIAL CODING/DECODING FOR ELECTRICAL COMPUTERS AND DIGITAL DATA PROCESSING SYSTEMS, by Donald M. Monro, or nearly equally probable combinations such as might arise in Golomb Coding, or other applications that are not described in detail herein, although these are merely example embodiments, and the scope of claimed subject matter is not so limited.

Furthermore, as described in co-pending U.S. patent application Ser. No. 11/77,081 titled LIFO RADIX CODER FOR ELECTRICAL COMPUTERS AND DIGITAL DATA PROCESSING SYSTEMS, by Donald M. Monro and U.S. patent application Ser. No. 11/777,122 titled FIFO RADIX CODER FOR ELECTRICAL COMPUTERS AND DIGITAL DATA PROCESSING SYSTEMS, by Donald M. Monro, a second codeword s of a combinatorial coder may be coded by employing a Last In First Out (LIFO) method and/or a First In First Out (FIFO) method, although these are merely example embodiments, and the scope of claimed subject matter is not so limited. These methods may employ a single or mixed radix, or base, and may additionally interleave data from time to time with bits of binary data. However, embodiments of the claimed subject matter are not limited to implementations including a combinatorial coder, and may employ Golomb coding, for example.

In one embodiment of the claimed subject matter, a buffer, such as a fixed length buffer may be employed as part of a LIFO method of coding data. For example, a buffer may be employed as part of an encoding process as performed for a second codeword s of a combinatorial coder. Furthermore, in this context, the term "buffer" may refer generally to a physical and/or logical portion of a memory device that may be utilized to store data. Data stored in a buffer may additionally be referred to as a "message", and/or a "buffer message", and these terms may be used interchangeably. Accordingly, the term "buffering" as referred to herein may refer generally to storing data and/or a message within a physical and/or logical portion of a memory device, and the term "buffer capacity" as referred to herein may refer generally to the storage space available for storing data and/or a message within a physical and/or logical portion of a memory device, although it is worthwhile to note that the scope of claimed subject matter is not limited in this respect. In one embodiment, the length of the buffer may be known to the coder and/or known to the decoder, although this is not a requirement. Additionally, in one embodiment, a dialogue may take place to inform the decoder of the buffer length, either initially or as coding progresses. Efficiency of the buffer may be calculated, and this information may be employed by a coder to establish an initial buffer length, for example. Furthermore, efficiency may be used to determine a new buffer length as coding progresses based at least in part on statistics of the data being coded. The statistics of the data may change as coding progresses, and as the statistics change a new buffer length may become optimal or nearly optimal or merely preferred to the length previously used. The coder may instruct the decoder to change the buffer length in some manner, or the buffer length may be changed adaptively by the coder and decoder following identical rules for determining the buffer length based at least in part on previously transmitted data. However, these are merely examples, and the claimed subject matter is not so limited.

In a radix coder, a symbol s may be selected that occurs within a set or grouping of data to be coded. In the application to be considered the symbol s may take g different values, which we may take as 0 to g−1 or equivalently 1 to g, since a simple mapping of the actual values of the symbols may be made into either the range 0 to g−1 or 1 to g, or into any other range of g successive values. Where there are g different values, g will be called the range of the values even though a mapping may be necessary to carry them into the range 0 to g−1 or any other suitable range. In the application to be considered all of the g different values of s may be equally likely to occur, or approximately equally likely, or acceptably equally likely. However the radix coder is not limited to equally likely symbols s. It is well known to experts in the field that if g is a power of 2, then a straightforward way of coding such symbols is by $\log_2(g)$ binary bits, and if they are equally likely the code uses the minimum possible number of bits. For example if g is 16, the numbers 0 to 15 may be coded by 4 bits and if all the numbers are equally likely as would be the case in tossing an unbiased 16 sided die, or spinning a wheel of fortune with 16 equally likely outcomes, coding the outcomes by 4 bits achieves the most efficient code, i.e. the shortest binary code, for a sequence of such symbols.

However, those skilled in the art may be aware that a difficulty arises if g is not a power of 2, for example if g is 11, the theoretical minimum number of bits required to code a sequence of 11 equally probable symbols is $\log_2(11) = 3.46$ bits per symbol, rounded to two decimal places. However, in binary digital communications, storage, or processing, it is not possible to use 3.46 bits to represent an individual symbol. However, situations often arise in which a sequence of such numbers may be stored or communicated efficiently. One such example might be in storing the outcomes of unbiased die tosses, coin tosses, lottery drawings or wheel of fortune spins or similar random events where the number of possible outcomes is not a power of 2. As will be explained in greater detail below, an application in accordance with one or more embodiments as related to run length coding as will be explained below.

Golomb coding is well-known and described in Golomb, S W: 'Run-length encodings', IEEE Trans. Inf Theory, 1966, 7, (12), pp. 399-401. Golomb Codes are simply one example of data coding. Therefore, while many of the examples described later are presented in terms of Golomb coding, it should be clear that it is intended that claimed subject matter not be limited in scope simply to Golomb codes (GCs). Other approaches to coding data may be employed and provide satisfactory results. Nonetheless, continuing with Golomb coding as one example, GCs are often used for run length coding, but, in principle, they are general purpose codes that may be used to encode any symbol, or sequence of symbols, as an integer numeral or a sequence of integer numerals. In one possible embodiment, a unique integer numeral may be assigned to a symbol and the symbol may then be coded by Golomb coding the corresponding numeral, for example. GCs may have relative advantages in that the range of numerals need not be known or constrained in advance.

In one particular example, a Golomb Code of a numeral I, module K (where K is the 'base' in this example) may be defined by (S, E, R) as follows:

S = the Sign of the numeral I, if appropriate (may be omitted if the numerals are either all positive or all negative).

M = the Magnitude of I

E = the exponent fix $(\log_k(M))$, where fix( ) denotes here a truncation operation, that is, rounding to the next lowest integer numeral.

R = M − $K^E$, is referred to here as a "residual."

The Magnitude of I, therefore, may be obtained by M = $K^E$ + R.

It is noted however, that $\log_k(0)$ may provide a mathematical quirk in that K raised to any power should not provide zero. One approach that may be employed to address this includes adding 1 to all non-negative integer numerals so that $\log_k(0)$ should not occur, although, of course, claimed subject matter is not limited in scope in this respect.

At times, out of convenience, for example, K=2, so that a Golomb Code, for example, may provide a form of binary floating point representation of variable length, with exponent E and residual R of variable length E bits. This case which may be known as Rice-Golomb coding, see for example R. F. Rice, "Some Practical Universal Noiseless Coding Techniques," Jet Propulsion Laboratory, Pasadena, Calif., JPL Publication 79-22, March 1979, is illustrated in FIG. 1, for example, although claimed subject matter is not limited in scope in this respect, of course.

In co-pending U.S. patent application Ser. No. 11/422,316, by Monro, filed Jun. 5, 2006, there is described how a Variable Length Coder (VLC), such as, for example, a Huffman Coder, may encode the exponent of a code, such as a Golomb Code, for example, for efficiently coding and compressing a stream of symbols, although this is merely an example embodiment, and the scope of claimed subject matter is not so limited.

However, the VLC may be adaptive or static, depending, for example, on the particular embodiment.

Furthermore, it is worthwhile to note that in addition to an embodiment of a method of coding of data, an embodiment may include a computer program incorporating such a method and/or a coder, such as one implemented in hardware, firmware, software, or combinations therefore. Embodiments may also include video and/or audio coders embodying such a method, video and/or audio compression systems whereby data may be encoded according to such a method, and in which such data may then be transmitted across an interconnect and/or a network for reconstruction by a decoder at the far end. Alternatively, the coded data may be stored rather than transmitted. These and many other embodiments are included within the scope of claimed subject matter.

Referring now to FIG. 1, there is illustrated an example embodiment of a Golomb-coded N bit fixed point binary integer, using sign and magnitude representation. The leading bit S indicates the sign. This is followed by a number of non-significant leading zeros. The first significant bit (FSB) occurs at location E, with the location of the FSB thereby indicating the value of the exponent. The remaining bits are represented by the subsequent E bits, this being known as the "residual" R in this context. The magnitude M of the integer, in this representation, is simply the value of the binary integer represented by the N bits labeled 0 to N−1.

Here, sign=1 or 0;

likewise, Magnitude=$M=\Sigma 2^n b_n$, where $b_n$ is the value of bit n, 0 or 1, and the summation runs from n=0 to N;

E=Position of FSB=fix($\log_2$ M) for M>=1; and

R=Residual=$M-2^E$, which has E bits for E>=1 and M>=2.

Given the representation of FIG. 1, to transmit data across a communications channel, in this embodiment, values of S (if appropriate) may be provided along with a positional value E and a value of a residual R. In one embodiment, the residual value may not be encoded, and the bits are simply sent one by one, but the claimed subject matter is not so limited. However, in this embodiment, an assumption may be made that all possible values of R are equally likely, or sufficiently equally. However, if the base K is not 2 or a power of 2, the coding of R into a binary representation may not be efficient. The Radix coder however solves this by disclosing a method of coding values s whose range 1 to g (or 0 to g−1) may not be a power of 2 but for which the assumption that all values of s are equally likely is acceptable.

As is well known, Golomb Coding works well at least in part because the probability density of R is normally relatively flat, even in cases where the probability density of M is uneven or skewed. The skewness of the distribution will be largely represented in the distribution of E, although even that may be generally well-behaved. There may be a smoothing effect on E because any value of E which is greater than 1 covers a range of $2^E$ different values of M. There is a flattening effect on R because the number of values of R is less than the number of possible values of M.

One aspect of Golomb Coding is that a number, which might or might not be a run length, is coded in two parts, one by an exponent E whose probabilities may vary widely, and the other by a fraction of E bits which may have a relatively but not perfectly flat probability. One embodiment of the claimed subject matter may employ a radix coder to code the fractional part of a Golomb Code, particularly if the base K is not a power of 2. Additionally, in at least one embodiment, a buffer may be employed when encoding and/or decoding data, as will be explained in greater detail later.

As described in co-pending U.S. patent application Ser. No. 11/777,256 titled COMBINATORIAL CODING/DECODING FOR ELECTRICAL COMPUTERS AND DIGITAL DATA PROCESSING SYSTEMS, by Donald M. Monro,; U.S. patent application Ser. No. 11/777,239 titled BLOCKING FOR COMBINATORIAL CODING/DECODING FOR ELECTRICAL COMPUTERS AND DIGITAL DATA PROCESSING SYSTEMS, by Donald M. Monro; and/or U.S. patent application Ser. No. 11/777,230 titled BLOCKING FOR COMBINATORIAL CODING/DECODING FOR ELECTRICAL COMPUTERS AND DIGITAL DATA PROCESSING SYSTEMS, by Donald M. Monro, a combinatorial coder may achieve a run length or other code by coding in two parts, in which the probabilities of the first part r may vary widely as in Golomb Coding of E, but the probabilities of the second part s may be perfectly or nearly flat, although these are merely example embodiments, and the scope of claimed subject matter is not so limited. This may allow efficient run length coding, particularly if a method may be used to code the second part of the code s which is perfect or nearly perfect in the sense that exactly the theoretical cost of coding s may be achieved. The example radix coder embodiment as described herein is one method of doing this in the case where the symbols may be sent in one long message. One or more decoder embodiments may decode the symbols in the reverse order that they were coded by a radix coder. This may be referred to as a radix coder implemented as a Last In First Out (LIFO) system, and may often be suitable as will be described below in more detail. As will be described, a sequence of values of different radix may be coded in this way provided the coder and decoder may select the identical radix to be used for each value. However the radix coder in its basic form assumes that it may form a message whose length is sufficient to code all the data in a sequence, which may be very large. The present example embodiment shows how to store or communicate the results of radix coding using a buffer of a limited size.

With such a combinatorial coder, a sequence of binary symbols of length n bits may be selected and it may be desired to code the occurrences of a particular binary symbol. This may be similar to run length coding except that in principle several runs may be coded at once. That is to say, if there are r occurrences of the binary symbol in the sequence of n bits, the combinatorial coder codes runs of occurrences (or equivalent non-occurrences) of the binary symbol. In this example, a first binary symbol code r indicative of the number of occurrences of the binary symbol within the grouping of data to be compressed may be generated, and a second binary symbol code s indicative of the pattern of occurrences of the binary symbol code may be generated. Likewise, for further groupings of data, this may be repeated. Respective binary symbol codes may then be combined to form a data code. A resulting data code may be a compressed form of the set or grouping of data. This data code may be transmitted or stored as desired.

Such a combinatorial coder may operate efficiently with a small number of symbols and short groupings or blocks of data, as just an example. It may, for example, be useful if data is a sequence of Binary digits in which two states occur, such as 'on' and 'off', or 'red' and 'green' or 'guilty' and 'not guilty'. Such binary data may in one or more embodiments be represented as a series of the digits '0' and '1'. Accordingly, such a combinatorial coder may be used to code runs or patterns of binary data and may be a viable alternative to previously known methods such as arithmetic coding or Golomb coding over which it has relative advantages as will be described. However, it is worthwhile to note that a radix coder in accordance with one or more embodiments is not limited in its application to a combinatorial coder or a Golomb coder or to any other application. Similarly the buffering of the Radix coder which is described herein in connection with one or more embodiments is not limited to any particular application of the radix coder and may be employed, for example, in any data coding implementation wherein a buffer may be suitable.

A radix coder operates by taking an initial message which may be empty and adding symbols $s_t$ to it which are indicative of values in a range $g_t$, said range or radix $g_t$ being indicative of the number of values that the particular symbol may take. As coding of symbols progresses the message grows in length. If the message is a binary number, as it grows the process that defines the code may cause many of the bits of the message to change as the message is constructed, so that the final bit pattern of the message is not known until all symbols have been coded.

In one embodiment, a buffer may be used to perform radix coding. In this embodiment, a message may be coded in the buffer. As the message is coded, in this particular embodiment, the coder knows the radix $g_t$ of the symbol $s_t$ to be coded next and may determine whether said new symbol would cause the message to grow larger than the capacity of the buffer. If the new symbol would cause the message to exceed the capacity of the buffer, for example, the coder may send the contents of the incomplete buffer to the decoder and start again with an empty buffer. The decoder is, of course, following the coder step by step and may also know if there are insufficient bits in the buffer to define the next symbol, so that it will know when to receive a new buffer of data. However, this is just one example embodiment, and the claimed subject matter is not so limited.

Figure 2:
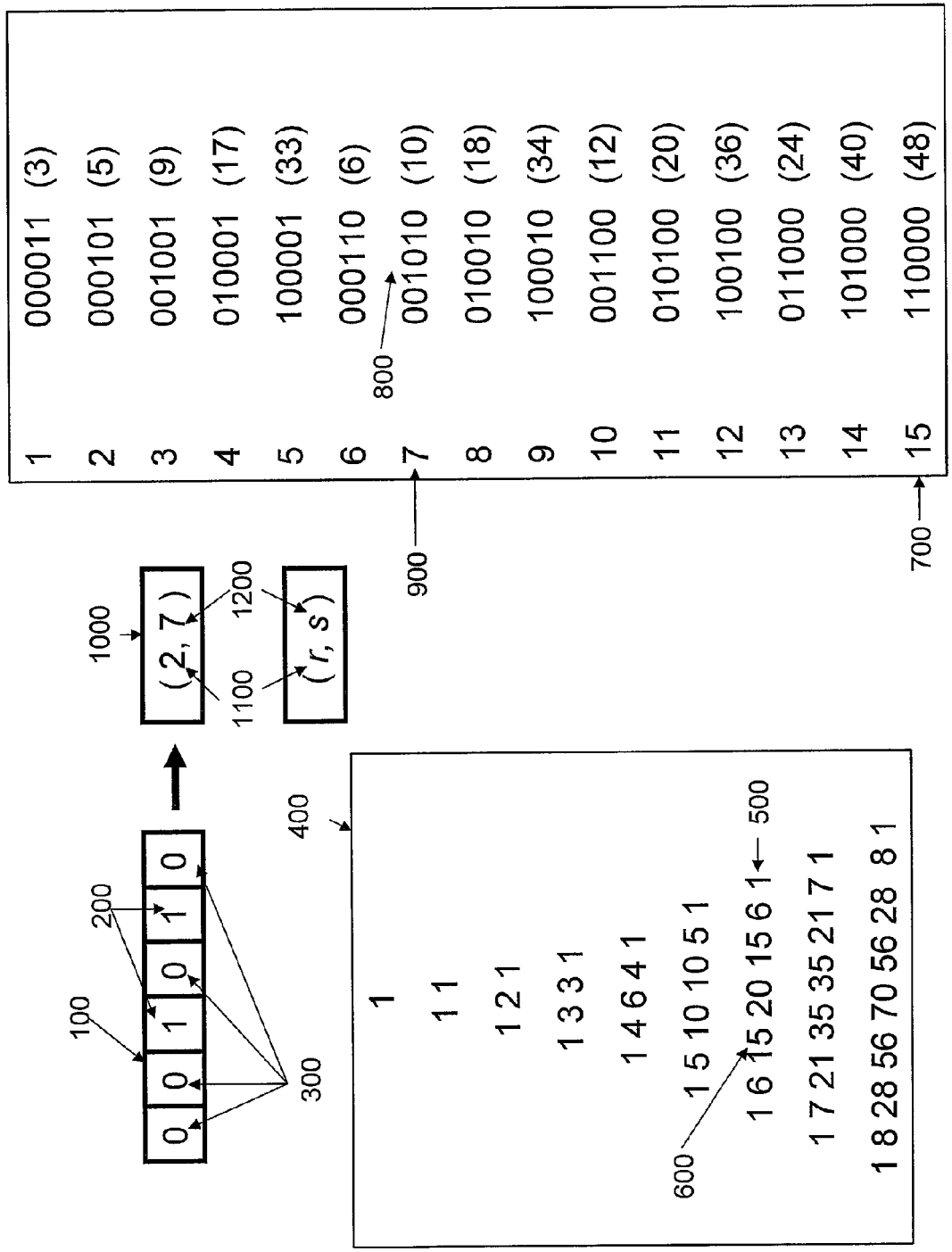
FIG. 2 is a diagram illustrating an example technique for data coding in accordance with one or more embodiments.

Referring now to FIG. 2, there is illustrated an embodiment of coding data. In this embodiment, a sequence of 6 binary bits 100 are encoded by employing a combinatorial coder such as described in co-pending U.S. patent application Ser. No. 11/777,256 titled COMBINATORIAL CODING/DECODING FOR ELECTRICAL COMPUTERS AND DIGITAL DATA PROCESSING SYSTEMS, by Donald M. Monro,; U.S. patent application Ser. No. 11/777,239 titled BLOCKING FOR COMBINATORIAL CODING/DECODING FOR ELECTRICAL COMPUTERS AND DIGITAL DATA PROCESSING SYSTEMS, by Donald M. Monro; and/or U.S. patent application Ser. No. 11/777,230 titled BLOCKING FOR COMBINATORIAL CODING/DECODING FOR ELECTRICAL COMPUTERS AND DIGITAL DATA PROCESSING SYSTEMS, by Donald M. Monro, although these are merely example embodiments, and the scope of claimed subject matter is not so limited. However, it is worthwhile to note that any length of sequence may be used and this is simply for illustrative purposes. In this embodiment, binary sequence 100 may be a pattern which contains '0' bits in certain positions 200 and '1' bits in other positions 300. The coder examines the binary sequence 100 and in particular determines that there are two '1' bits 200 in the pattern. Although there are $2^6=64$ different patterns of 6 bits, as is generally known, there is a certain number of patterns or combinations of 6 bits including two '1' bits, usually called $_6C_2=15$, which is much less than 64. The table of numbers 400 is well known as Pascal's triangle, and lists all the values of $_nC_r$ for row n from 0 to 8 with r counting across each row starting from 0. As is well known, each number in the triangle is the sum of the two immediately above it, so the table may be rapidly constructed, and also that the sum of the numbers across row n is $2^n$, i.e. the number of different patterns of n bits. To code the binary sequence 100, the number of '1' bits is 2 and it is noted in Pascal's triangle 400 in row 6 that for r=2 at 600 there are 15 patterns corresponding to r=2. The 15 patterns are listed in table 700, from which it is found at 800 that pattern number 7 at 900 is the one corresponding to the data 100. The code for data 100 is therefore the two symbols at 1000 which are (2, 7), or in general (r, s). The code to describe data 100 is in two parts at 1000, a first code r 1100 that represents 2 and a second code s 1200 that represents 7. This code may contain fewer than 6 bits and if so the data 100 may be compressed by the code 1000. Equally the coder might have determined the number of '0' bits 300 as 4, which would give 4 as the first code r and one of 15 patterns with 4 zeros as the second code s, because $_6C_4$ is the same as $_6C_2=15$.

A combinatorial coder and decoder may refer to lists of patterns s for different lengths of sequences n and different numbers of '1' bits r within these sequences. In general there are $2^n$ different patterns of the data but only $_nC_r$ patterns with r bits, which is always less than $2^n$. The method relies on this fact, that $_nC_r$ is always less than $2^n$, to achieve compression. The lists of patterns may be ordered in any convenient way which enables the coder and decoder to select the same pattern s. Alternatively they may be calculated by a coder or decoder. The method may be referred to as Combinatorial Coding because it may be based at least in part on selecting ordered combinations to describe the positions of binary symbols in the data, in this case the binary symbol being the binary digit '1'.

Similarly, a coder and decoder may be employed with '0' bits. If there are r '1' bits in data of n bits, then there are n−r '0' bits. Accordingly, the first code would be n−r and the second code would indicate a pattern with n−r '0' bits. The number of patterns with n−r bits is $_nC_{n-r}$ which is always the same as $_nC_r$. The number of bits r may efficiently be coded by Huffman, Golomb, hybrid Huffman/Golomb as taught in U.S. patent application Ser. No. 11/422,316, arithmetic coding or any other method. It is taught in U.S. patent application Ser. No. 11/422,316 that the hybrid Huffman/Golomb coder may outperform Huffman coding in some circumstances and that it even approaches the efficiency of Huffman coding with probability distributions that are ideal for Huffman coding. As the hybrid Huffman/Golomb coder is of relatively low complexity, it may be used to code the number of bits r in one or more embodiments, although the scope of the claimed subject matter is not so limited.

The pattern number s may similarly be coded by Huffman, Golomb, hybrid Huffman/Golomb as taught in U.S. patent application Ser. No. 11/422,316, arithmetic coding and/or the like, including methods not described in detail. In this embodiment, once r is known, all the $_nC_r$ possible patterns are equally likely. Were $_nC_r$ a power of 2, the coder may do no better than code s by $\log_2(_nC_r)$ bits, as will be known to any practitioner skilled in the art. Sometimes this occurs, and sometimes $_nC_r$ is just less than a power of 2. In both these instances, as they arise, the coder may simply use $\log_2(_nC_r)$ bits without further coding. Efficient coding of $_nC_r$ equally probable outcomes if $_nC_r$ is not a power of 2 is done by the radix coder.

Gradually, in this manner, a set of data may be coded. As coding proceeds, a coder may transmit to a decoder information about binary symbols that have been located, such as position(s), in real time for some embodiments. Alternatively, coded data may be stored locally as a compressed representation.

The combinatorial coder, as described above, may be expressed in pseudo-code as follows:

```
For A = Binary symbol
    Indicate R = Number of Occurrences of A
    Indicate the particular pattern S of R Occurances
End
```

In one embodiment, a radix coder may be employed to code symbols whose range may not be a power of 2 but whose probabilities are equally likely, or nearly equally likely, or acceptably equally likely. Consider a sequence of symbols s whose range is 0 to g−1, in which g comprises the radix of the code. A message m may be formed which may comprise a very large integer number into which symbols may be coded. Initially, m may be set to zero. However in considering buffering of the coded symbols, we may equally well consider m to be a message buffer, which is filled up by the coded data until its capacity is reached or nearly reached, and then its contents are stored or communicated before coding continues with a new, empty message buffer. As is well known, a computing device may represent integer numbers by using a 'word' comprising a certain number of bits, which may be limited. However it is well known that arbitrarily large numbers may be represented by using multiple words. Methods of representing arbitrarily large numbers and performing arithmetic operations on them are not described herein but it is known to experts in the field that it is possible and feasible to do so. In one embodiment, a number may be accumulated which may also be large, the accumulated radix of which may be referred to as v.

Figure 3:
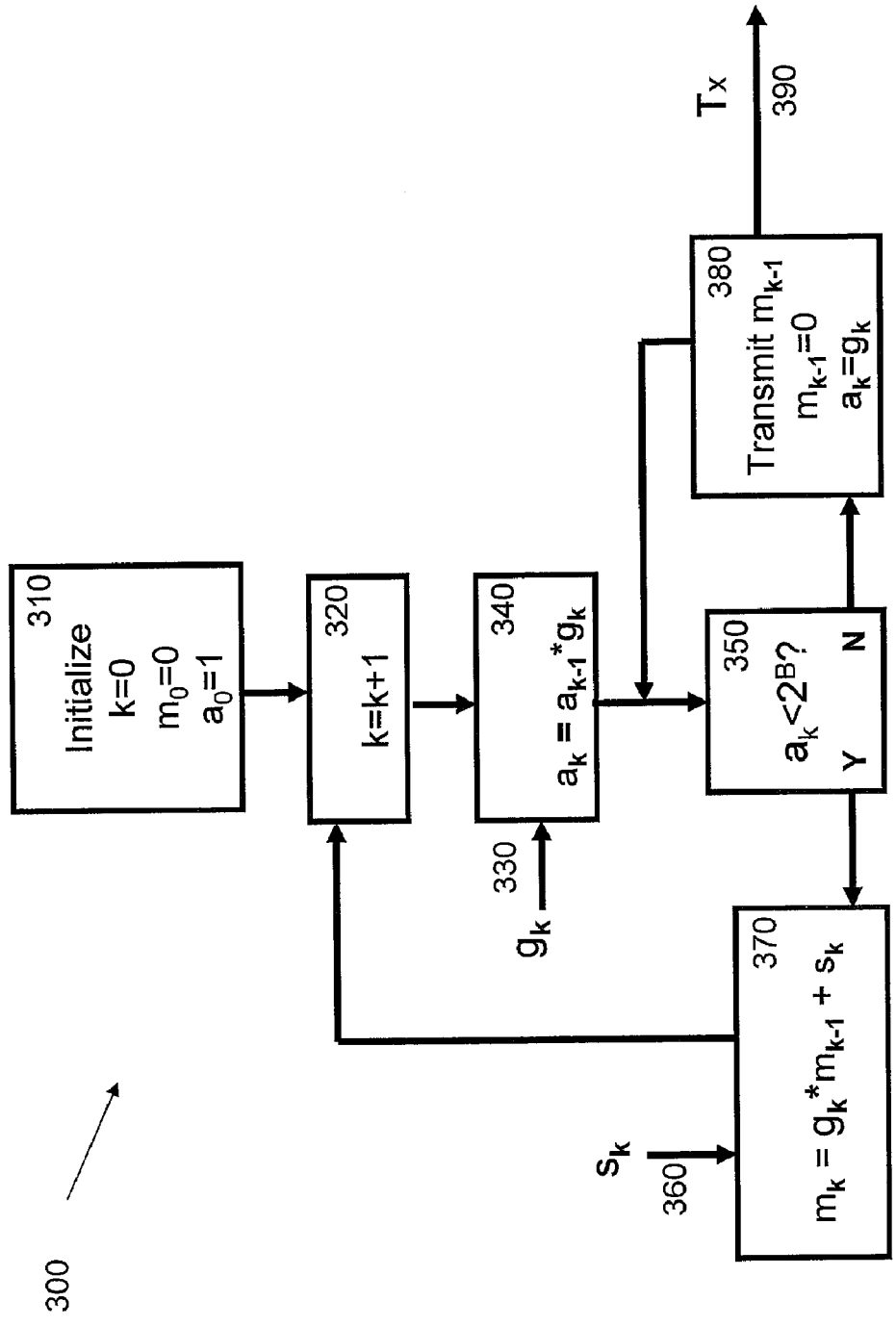
FIG. 3 is a diagram illustrating an example technique for data coding in accordance with one or more embodiments.

In accordance with one embodiment, a method of buffering data symbols from a sequence of data symbols may be performed. The data symbols may each have a radix, for example. In this embodiment, a maximum value resulting from coding a data symbol of the sequence into a buffer may be determined. The maximum value may be based, at least in part, on a radix of the data symbol being coded. The maximum value may be compared with a capacity of a buffer, and a buffer may be scaled based at least in part on the radix. For example, if the maximum value does not exceed the buffer capacity, the data symbol may be coded into a scaled buffer. Furthermore, one or more portions of the method may be repeated for one or more additional data symbols of the sequence. However, the claimed subject matter is not so limited. As one example embodiment, as illustrated in FIG. 3, a flow diagram of a process 300 of coding a number from 0 to g−1 according to an embodiment is illustrated. However, initially, it is worthwhile to note that a range of 0 to g−1 may be equivalent to coding numbers in the range 1 to g, as conversion from one range to the other may be accomplished by subtracting 1 before coding and adding one after decoding. In this embodiment, initially, the value of the message or message buffer m is set to zero. This will be referred to as $m_0$. To insert a first symbol $s_1$ into the code, it is simply added to $m_0$. to give $m_1$ i.e.:

$$m_1 = m_0 + s_1$$

Of course, knowing that $m_0=0$, one may have simply started with $m_1=s_1$. Now the range of $s_1$ is 0 to g−1, so there is no ambiguity in the code if we add a second symbol by:

$$m_2 = g*m_1 + s_2 \qquad (1)$$

In a binary digital apparatus, the bits representing $s_1$ and $s_2$ may not in general be separated in a simple way, as they may be in the case where g is a power of 2, by shifting $s_1$ left before adding $s_2$. Many of the bits of the message are likely to change if $m_1$ is multiplied by g, and again if $s_2$ is added so that merely extracting the bits of the code will not decode the message.

This process may be repeated to code as many values of s as is desired. In general if t−1 symbols $s_1 \ldots s_{t-1}$ of range 0-g, $s_1, \ldots s_{t-1}$ have previously been coded into a message $m_t$−1, another symbol $s_t$ may be coded by:

$$m_t = g*m_{t-1} + s_t \qquad (1a)$$

Equation 1a describes the radix LIFO coder with fixed radix g. Once $m_{t-1}$ has been used to calculate $m_t$, $m_{t-1}$ is no longer required. Therefore a saving in memory is achieved by reusing the message. Calling the message or buffered message m, it is recalculated as each symbol $s_t$ is coded i.e. by a recurrence:

$$m = g*m + s_t \qquad (2)$$

In at least one embodiment, the radix coder may also be extended to be a multiradix coder. It may be a further aspect of the radix coder that the radix g used with successive values of s does not need to be the same. Referring, for example, to the combinatorial coder, it will be understood that the value of r will change as successive groups of binary symbols are coded, and each time the range of s will be 0-$_nC_r$. Provided the coder may communicate the value of r to the decoder, it may be possible to change the value of r as often or as seldom as advantageous. Also referring to the Golomb Coder, the range of the residual R depends on exponent E. R is a number in the range 0 to $K^{E-1}$. This may be a number which may be suitable for coding by the Radix coder. In one embodiment, an assumption may be made that the radix g=$K^E$ or alternatively the value of E may be communicated by some means to the decoder. Alternatively, the radix g=$K^E$ may be otherwise determined by the decoder in response to received information or in some other way not disclosed herein in detail.

As each symbol $s_t$ is coded, a radix $g^t$ may be used. In this way the radix g may change as often as is advantageous for the particular coding task. The variable radix LIFO coder may therefore be expressed as:

$$m = g_t*m + s_t \qquad (3)$$

An additional calculation that may be carried out as the coding proceeds is the determination of the maximum numerical value of the data in the message. If the message is being coded into a buffer of finite length, B bits as in FIG. 5, the maximum number that the buffer may represent before exceeding the capacity of the buffer is $2^B-1$. Initially, with the message buffer empty, the maximum it will contain is 0. As coding proceeds, the coder calculates (product of the radices −1) which is the maximum value that might have been coded. After a first symbol of radix $g_1$ has been coded, the maximum value of the message is $g_1-1$. For an embodiment, the buffer used may be large enough to accommodate the largest value of $g_1-1$ that may occur. It need not, however be large enough to accommodate the largest symbol twice. Assuming it is large enough to hold two symbols, after a second symbol of radix $g_2$ has been coded into the message by the process described by equation (3), the maximum value of the message is $g_1*g_2-1$, and so on, so that after symbol $s_{t-1}$ has been coded, the maximum is $g_1*g_2* \ldots *g_{t-1}-1$. Before coding symbol $s_t$, the coder may check that $g_1*g_2* \ldots *g_{t-1}-1$ will not be larger than the capacity of the buffer $2^B-1$. If it is larger, then the coder may communicate or store all B bits of the buffer, which contains the codes of t−1 data values, and start a new, empty buffer with initial value 0, and a new maximum coded value of 0, into which it codes what would have been $s_1$ of radix $g_t$, now as $s_1$ of radix $g_1$. The coder continues coding symbols and restarting the buffer a number of times to code the data in its entirety or at least partially. In all the equations representing the coding of the data into a message buffer, the buffer may be reused as often as is advantageous provided it is stored or communicated before the buffer is restarted. In this example, the buffer, which is finite, has not been completely filled. The length of the radix code is increased slightly with each buffer that is restarted. Although the radix coder can, in principle, achieve perfect coding of a long stream of symbols of mixed radix provided the probabilities are flat, in practice if a finite buffer is to be used the length of the coded data may exceed the theoretically minimum length. However as will be seen the amount of this increase may be estimated and a buffer length B may be determined to limit this increase to any desired amount by making the buffer sufficiently long.

In the following description, the decoding process works backwards through the symbols, as is necessitated by the encoding by the LIFO method described above. Accordingly, the decoding process works backwards through the symbols so that at each step $m_{t-1}$ is recovered from $m_t$. As described herein, as well as in the following claims and figures, the decoding process may be described as recovering something called $m'_{k+1}$ from $m_k$, which is equivalent to recovering $m_{t-1}$ from $m_t$. Here, the k runs in the opposite direction from the t. For example, due to the encoding by the LIFO method the process of recovering $m'_{k+1}$ from $m_k$ utilizes k running from k to 1, in the opposite direction from the t.

Embodiments of a decoding process will now be described. Continuing the example where there are only two symbols coded of radix g, $s_2$ can be recovered by extracting the remainder if $m_2$ is divided by g:

$$s_2 = \text{mod}(m_2, g)$$

where the mod function calculates the integer remainder if $m_2$ is divided by g. This may be easily seen to be identical to the calculation:

$$s_2 = m_2 - g * \text{fix}\left(\frac{m_2}{g}\right)$$

where $$\text{fix}\left(\frac{m_2}{g}\right)$$

rounds the quotient $$\frac{m_2}{g}$$

to the integer of next lowest magnitude. At the same time the previous message or message buffer $m_1$ can be recovered by:

$$m_1 = \text{fix}\left(\frac{m_2}{g}\right)$$

Similarly $s_1$ is recovered by:

$$s_1 = \text{mod}(m_1, g)$$

Although from the discussion above we also know that $s_1 = m_1$.

In the general case, if we have message or message buffer $m_t$, we recover $s_t$ and $m_{t-1}$ from it by:

$$s_t = \text{mod}(m_t, g); \quad (4)$$

and $$m_{t-1} = \text{fix}\left(\frac{m_t}{g}\right) \quad (5)$$

Equations 2 and 3 describe a fixed radix g LIFO decoder for the radix g LIFO encoder of equation 1. As with coding, in decoding we may reuse message or message buffer m as the decoding proceeds:

$$s_t = \text{mod}(g, r) \quad (6)$$

$$m = \text{fix}\left(\frac{m}{g}\right) \quad (7)$$

Equations 6 and 7 describe a decoder for a coder described by equation 2. In the case of equation 3, where the radix g may vary from symbol to symbol, decoder may be described by $$s_t = \text{mod}(m, g_t) \quad (8)$$

$$m = \text{fix}\left(\frac{m}{g_t}\right) \quad (9)$$

Similar to embodiments of coding described above, the decoder may accumulate the product of the radices to determine if there is no more data to be decoded in the buffered message. In one embodiment, as decoding proceeds, the decoder calculates (product of the radices −1) which at all times is the maximum value that might have been previously decoded. If the message is being decoded from a buffer of finite length, B bits as in FIG. 5, the maximum number that the buffer may represent before exceeding the capacity of the buffer is $2^B-1$. Initially the decoder acquires a buffer of B bits, without knowing how many coded symbols the buffer contains. After a first symbol of radix $g_1$, has been decoded, the value of the message will have been greater than or equal to $g_1-1$. In an embodiment, the buffer used may be large enough to accommodate the largest value of $g_1-1$ that may occur. It need not, however be large enough to accommodate the largest symbol twice. Assuming the buffer is large enough for the first two symbols, after a second symbol of radix $g_2$ has been decoded from the message buffer by the process described by equations (8) and (9), the message will have been greater than or equal to $g_1*g_2-1$, and so on, so that after symbol $s_{t-1}$ has been coded, the maximum is $g_1*g_2* \ldots *g_{t-1}-1$. Before decoding symbol $s_t$, the coder may check that $g_1*g_2* \ldots *g_{t-1}*g_t-1$ will not be larger than $2^B-1$. If it is larger, then the decoder will know that the coder started a new buffer at this point. The decoder has decoded the same t−1 data values as were coded by the coder. The coder then acquires new buffer of B bits from which it continues decoding symbols, and restarts the calculation of (product of radices)−1. The decoder refreshes the buffer a number of times to code the data in its entirety. In all the equations representing the coding of the data into a message buffer, the buffer may be reused as often as is advantageous provided it is stored or communicated before the buffer is restarted.

Taking a specific numerical example, suppose the buffer comprises 5 bits, in which case the largest value it may hold would be 31. Suppose the radix g=5, and begin with the empty buffer $m_0$=0. Before coding the maximum value that the buffer may contain is 0. If the first number to be coded into the buffer, $s_1$, is 3, then $m_1$=3, and the maximum that may have occurred is 4. To code a next number $s_2$=4 we calculate $m_2$=3*5+4=19. In effect the numbers 3 and 4 are contained within the value 19, which is within the capacity of the buffer. One experienced in the field would recognize that 19 converted to base 5 would be $3_5 4_5$. The maximum possible value that might have been coded into the buffer at this point is 5*5−1=24 (which obviously is $4_5 4_5$). To code a third number of radix 5 would give a maximum value of 5*5*5−1=124 which would exceed the buffer capacity. Therefore the coder will at this point store or communicate the value 19 before coding the third number into a new, empty buffer. To decode, the last digit coded, $s_2$, is recovered by mod(19,5) which is 4, and $s_1$1=$m_1$=fix(19/5)=3. At this point the maximum value that the buffer may have contained is 24, and before decoding a third value, the decoder determines that the new maximum would be 124, which is beyond the capacity of the buffer. The decoder therefore would acquire a new buffer and restart the maximum value calculation. Of course, this is just one example, and the claimed subject matter is not so limited.

Where it is acceptable to receive the contents of a buffer and decode symbols from the buffer in reverse order, the LIFO buffered Radix coder may code the sequence of values of s. Each value $s_t$ may have an associated radix $g_t$. In the examples above, two symbols whose range is not a power of 2 have been coded and recovered from a buffer of finite length, however the last symbol to be coded into the buffer has been recovered first. This may be describes as a Last In First Out or LIFO buffer. As described, such a LIFO buffer results in the decoder recovering symbols from the buffer in the reverse order that the coder entered them. However this LIFO behavior may be only for the length of the buffer. New buffers may be decoded in the order they were stored or communicated, although the claimed subject matter is not limited to processing buffers in any particular order.

Figure 4:
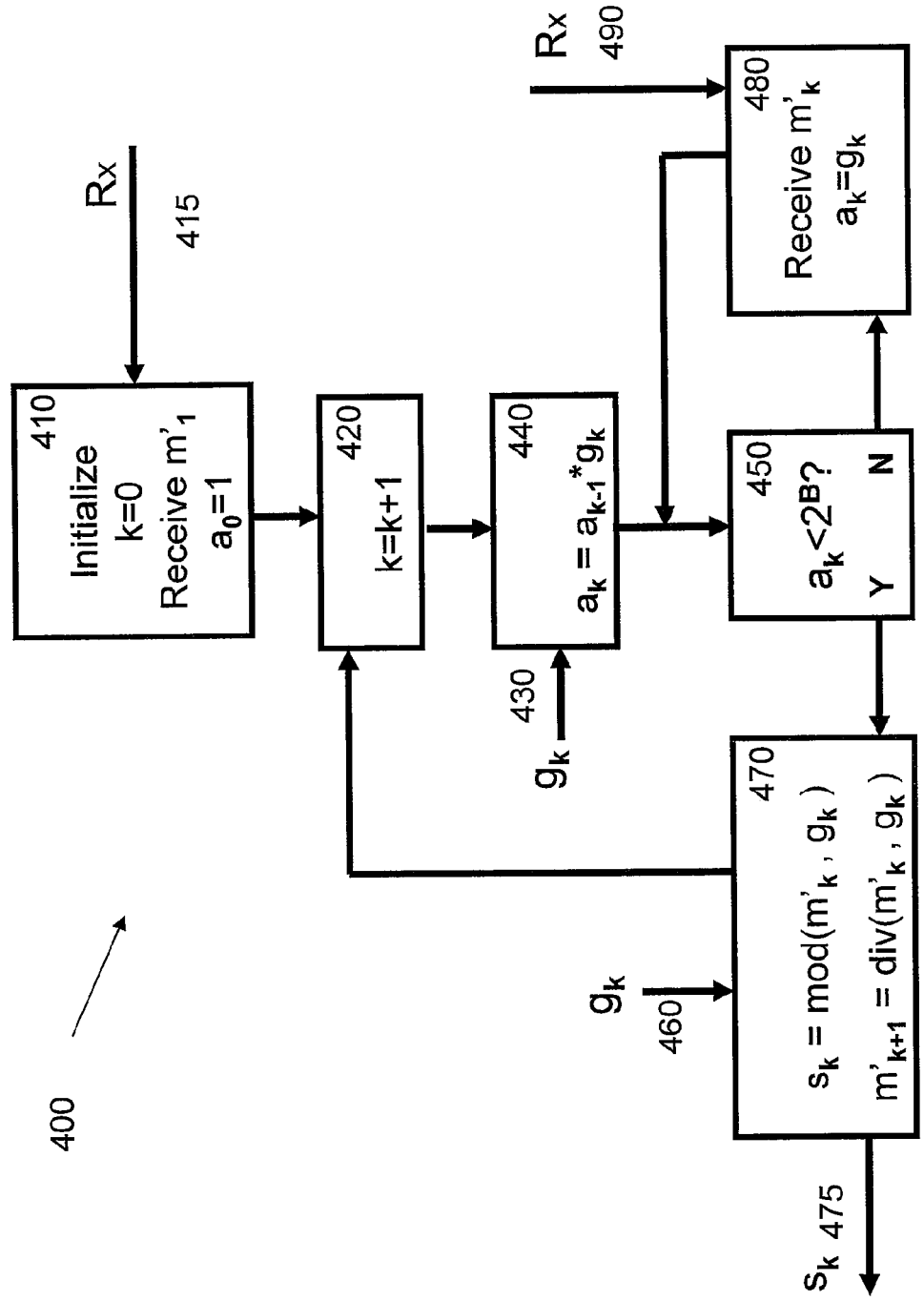
FIG. 4 is a diagram illustrating an example technique for data decoding in accordance with one or more embodiments.

Continuing with FIG. 3, an embodiment of the buffered Radix coder 300 which implements an embodiment of the Radix coder of equation 3 will be described. A buffer of capacity B bits may hold a coded value equal to m. The buffer is not shown explicitly in FIG. 3 but is referred to with reference to its held value m. The initialization of a coding task may be carried out by processing block 310, which may set the current symbol number to be coded k=0, and may assign the initial value of the buffer to be empty $m_0$=0, and may assign the initial buffer maximum value to be $a_0$=1. At processing block 320 current symbol number k may be incremented by 1, k=k+1. Radix $g_k$ of current symbol $s_k$ may be provided as input 330 to processing block 340 which may accumulate what the buffer maximum value $a_k$ would be if symbol $s_k$ were coded into the current buffer $m_{k-1}$, said accumulated buffer maximum value being $a_k = a_{k-1} * g_k$. Comparison block 350 may compare accumulated buffer maximum value $a_k$ to the value $2^B$ which would exceed the maximum value that buffer $m_k$ may hold. If $a_k < 2^B$, current symbol $s_k$ 360 may be coded by processing block 370 to produce an updated buffer $m_k = g_k * m_{k-1} + s_k$, and processing may return to processing block 320 where current symbol number k may be incremented by 1, k=k+1. In this manner a sequence of symbols $s_k$ may be coded into buffer $m_k$ until the comparison block 350 detects that the buffer capacity B bits would be exceeded. If $a_k \geq 2^B$ processing block 380 may cause the buffer value $m_{k-1}$ to be stored or transmitted 390 to a decoder 400 such as is shown in FIG. 4. Processing block 380 may reset buffer value $m_{k-1}$ to the empty condition $m_{k-1}$=0 and accumulated buffer maximum $a_k$ may be set to the maximum accumulated buffer value $g_k$ that may occur if $s_k$ is coded into the buffer. Processing then may return to processing block 350 although it may equally well go directly to processing block 370, as it is understood that as long as no radix $g_k$ in block 380 exceeds the buffer capacity the coding of $s_k$ may be done directly by block 370. If any $g_k$ at 380 exceeds the buffer capacity an error has occurred, and the coding would become stuck by cycling between processing blocks 350 and 380. It will be clear to one skilled in the art that there is a choice between continuing with an error as would occur if processing block 380 passed control to processing block 370, or terminating coding if such an error occurs. Optionally additional circuitry may be provided to detect this situation and take appropriate action. Precisely what constitutes appropriate action would depend on the circumstances of an embodiment and the claimed subject matter is not so limited. Coding of symbols $s_k$ 360 into buffer m as $m_k$ may continue until as many symbols as desired have been coded into buffers. Any incomplete buffer would, of course, be stored or transmitted at the conclusion of coding.

Referring now to FIG. 4, there is illustrated a flow diagram of an example process 400 of an embodiment of a radix decoder which decodes buffered messages, such as message 390 of FIG. 3. However, it is worthwhile to note that the claimed subject matter is not limited in this respect. In this embodiment, initialization of a coding task may be carried out by processing block 410, which may set current symbol number to be decoded k=0, may receive an initial B bits into initial buffer $m'_1$=0, and may assign initial buffer maximum value $a_0$=1. At processing block 420, current symbol number may be incremented by 1, k=k+1. Radix $g_k$ of current symbol $s_k$ may be provided as input 430 to processing block 440, which may accumulate what the buffer maximum value $a_k = a_{k-1} * g_k$ would be if symbol $s_k$ had been coded into buffer $m'_k$, for example. Comparison block 450 may compare accumulated buffer maximum value $a_k$ to the value $2^B$ which would exceed the maximum value that buffer $m_k$ may hold. If $a_k < 2^B$ then processing block 470 may decode current symbol $s_k$=mod($m'_k, g_k$) 475 and may update buffer $m'_{k+1}$=div($m'_k, g_k$) and processing may return to processing block 420 where the current symbol number k may be incremented by 1, k=k+1. In this manner a sequence of symbols $s_k$ may be decoded from buffer $m'_k$ until the comparison block 450 detects that the buffer capacity B bits would be exceeded. If $a_k \geq 2^B$, processing block 480 may receive at 490 a new buffer $m'_k$ of B bits and accumulated buffer maximum $a_k$ may be set to the maximum accumulated buffer value $g_k$ that may occur if $s_k$ is decoded from the buffer $m'_k$. Processing then may return to processing block 450 although, alternatively, processing may go directly to 470, if, for example, no radix $g_k$ exceeds the buffer capacity the decoding of $s_k$. In this embodiment, if any $g_k$ exceeds the buffer capacity, an error has occurred, and the decoding will become stuck by cycling between processing blocks 450 and 480. If an error occurs, a selection may be made between continuing with an error as would occur if processing block 480 passed control to processing block 470, or terminating decoding if such an error occurs. Optionally, additional circuitry may be provided to detect the occurrence of an error, and/or to be responsive to the occurrence of an error by taking an appropriate action. An appropriate action may depend at least in part on the circumstances of the error and/or events causing the error, and the claimed subject matter is not limited in this respect. Decoding of symbols $s_k$ 475 may continue sequentially until as many input buffers have been processed as may be required. Additionally or alternatively, if $v_k \geq 2^B$, then the buffer $m_k$ has been fully decoded and control signal 400 causes the multiplexer processing block 450 to receive from store or transmission 490 a new value for buffer $m_k$ 460 which may be used by processing block 470 to decode the symbol $s_k$ 475 and calculate the previous buffer $m_{k-1}$ 470. Initially with the buffer maximum $v_0=1$, it will be found that $v_k \geq 2^B$ so that the first buffer in the sequence is acquired. The decoder 400 may continue to decode output symbols $s_k$ 475 under control of comparator block 430 with the multiplexer block 450 providing buffer $m_k$ to processing block 465 either from the 'previous' buffer $m_{k-1}$ 470 delayed by delay block 480, or from new buffers received 445. Decoding of symbols $s_k$ 475 may continue sequentially until as many input buffers have been processed as may be advantageous.

Figure 6:
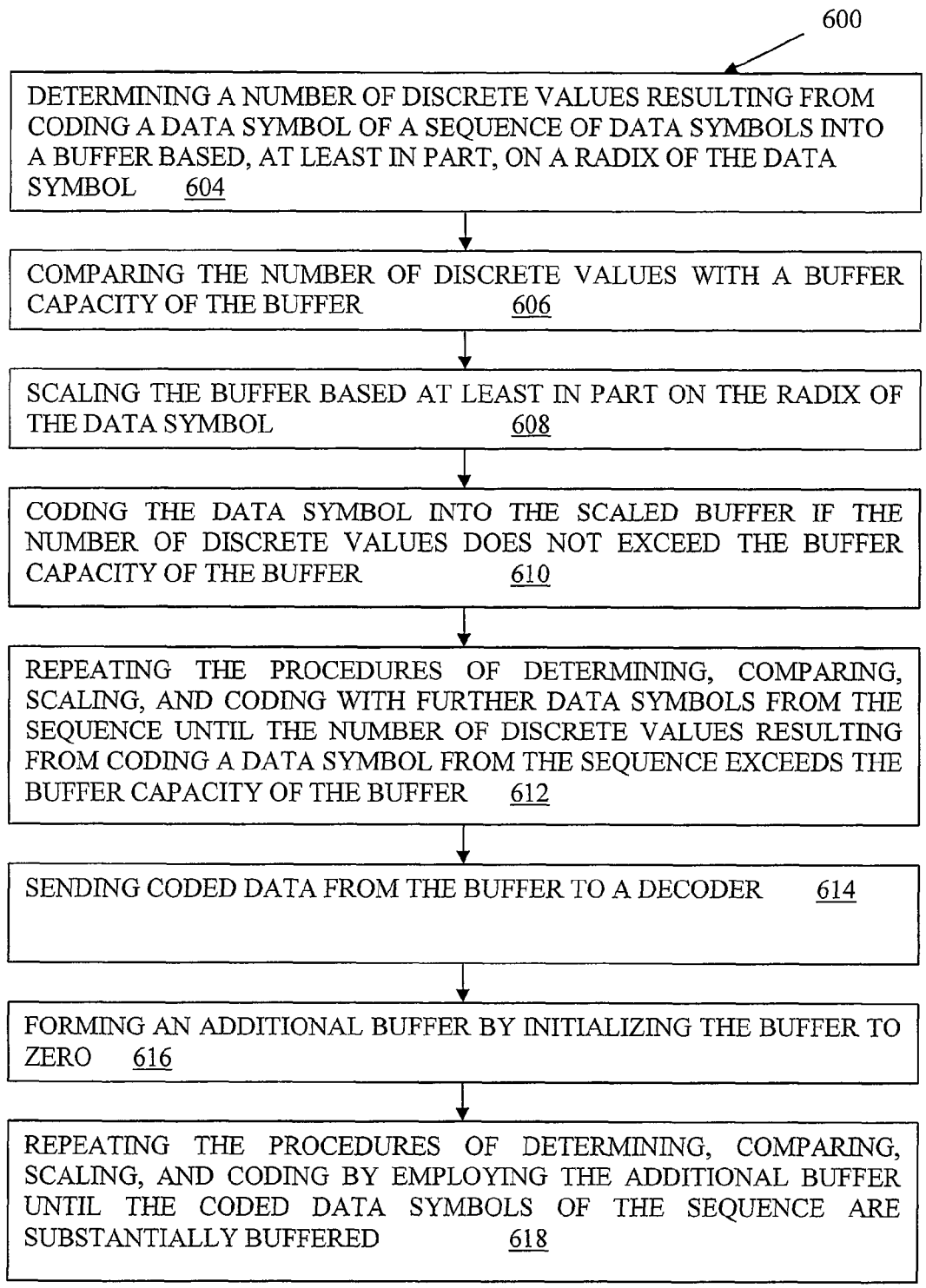
FIG. 6 is a flow diagram illustrating an example method for data coding in accordance with one or more embodiments.

Referring to FIG. 6, a flow diagram illustrates an example procedure embodiment in accordance with one or more embodiments, although the scope of claimed subject matter is not limited in this respect. Procedure 600 illustrated in FIG. 6 may be used to buffer data symbols from a sequence of data symbols, the data symbols each having a radix, for example, although the scope of claimed subject matter is not limited in this respect. Additionally, although procedure 600, as shown in FIG. 6, comprises one particular order of blocks, the order in which the blocks are presented does not necessarily limit claimed subject matter to any particular order. Likewise, intervening blocks shown in FIG. 6 and/or additional blocks not shown in FIG. 6 may be employed and/or blocks shown in FIG. 6 may be eliminated, without departing from the scope of claimed subject matter.

Procedure embodiment 600 depicted in FIG. 6 may be implemented in software, hardware, and/or firmware in alternative embodiments, and may comprise discrete operations. As illustrated, procedure embodiment 600 starts at block 604 where a number of discrete values may be determined, where the number of discrete values result from coding a data symbol of a sequence of data symbols into a buffer based, at least in part, on a radix of the data symbol. For example, the sequence of data symbols may comprise mixed radix data symbols. Additionally or alternatively, the sequence of data symbols may comprise a second part of a code resulting from combinatorial coding. At block 606, the number of discrete values may be compared with a buffer capacity of the buffer. For example, the sequence of data symbols has a radix, and the comparing may be based at least in part on a comparison of the radix of a data symbol to be coded with an accumulated radix of previously coded data symbols. Additionally or alternatively, the capacity of the buffer may be altered in response to the comparing. For example, the capacity of the buffer may be altered by increasing the capacity of the buffer to accommodate at least a portion of the coded data symbol. At block 608, the buffer may be scaled at least in part based on the radix of the data symbol if the number of discrete values does not exceed the buffer capacity of the buffer. At block 610, the data symbol may be coded into the scaled buffer if the number of discrete values does not exceed the buffer capacity of the buffer. At block 612, the procedures of determining, comparing, scaling, and coding may be repeated with further data symbols from the sequence until the number of discrete values resulting from coding a data symbol from the sequence exceeds the buffer capacity of the buffer. At block 614, coded data may be sent from the buffer to a decoder. For example, the buffer may be provided to a decoder after the number of discrete values resulting from coding one of the data symbols from the sequence exceeds the buffer capacity of the buffer, where the length of the buffer may be known by the decoder prior to providing the buffer to the decoder. At block 616, an additional buffer may be formed by initializing the buffer to zero. At block 618, the procedures of determining, comparing, scaling, and coding may be repeated by employing the additional buffer until the coded data symbols of the sequence are substantially buffered.

Figure 5:
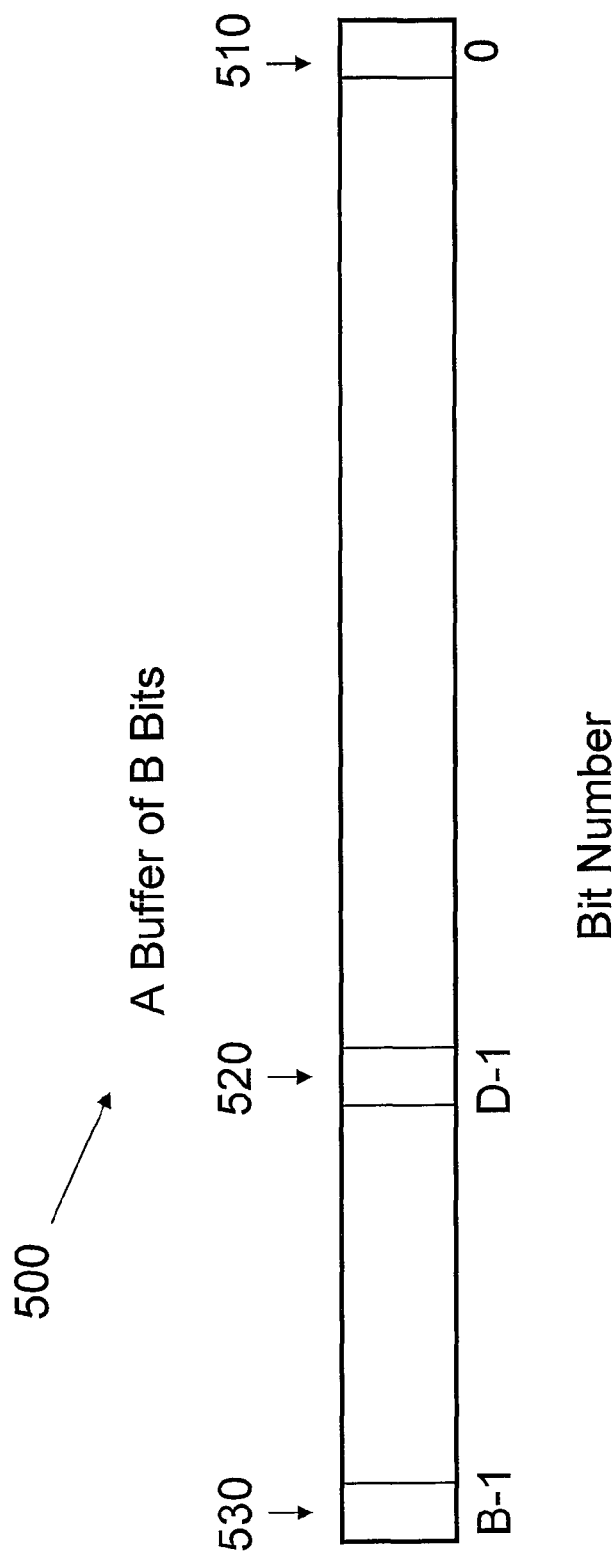
FIG. 5 is a diagram illustrating an example technique for data buffering in accordance with one or more embodiments.

Referring now to FIG. 5, there is illustrated an example of a buffer 500 of B bits such as $m'_k$ 460 in FIG. 4. The bits are numbered from bit 0 510 to the maximum available bit B-1 530. At a stage in the decoding process, radices $g_1, g_2, g_3, \ldots g_{v-1}$ have been used in decoding symbols from buffer 500. The comparator 430 in FIG. 4 has determined that $g_1 * g_2 * g_3 * \ldots * g_{v-1}$ is less than $2^B$, so that symbols $s_1, s_2, s_3 \ldots g_{v-1}$ have been decoded from this buffer. If $fix(\log_2(g_1 * g_2 * g_3 * \ldots g_{v-1}))=D$, then the maximum bit number that has been used in decoding $s_1, s_2, s_3 \ldots s_{v-1}$ is D-1 520. If a next radix $g_v$ causes the product $g_1 * g_2 * g_3 \ldots * g_{v-1} * g_v$ to be greater than or equal to $2^B$, the next symbol $s_v$ cannot be decoded from this buffer and a new buffer may be acquired for processing to continue with this $g_v$ as the new $g_1$ from which $s_v$ may be decoded as the new $s_1$. In at least one embodiment, whenever g is a power of 2, say $g_1=2^b$, multiplying m by $g_t=2^b$ is the same as shifting m to the left by b bits. However, the claimed subject matter is not so limited.

For convenience, it may be desirable to represent binary numbers with the least significant bit, signifying value 0 at the right hand end of the binary number. Of course, this may be an accepted notation for representing binary numbers, but may not comprise an exact representation of their organization if implemented in hardware and/or software, for example. In one embodiment, this accepted notation may be utilized if g is a power of 2, and the radix coder may be implemented by shifting the message buffer m by b bits to the left before adding the value of s. Alternatively, bits that comprise s may be pushed into the right hand end of the message buffer m, shifting m to the left before each bit of s is pushed in, doing this for each of the b bits of s. The bits of s could, of course, be taken in any order, such as reverse, the claimed subject matter is not so limited. Consider that the leftmost bit of s is pushed in first, as would be the case if s is introduced by adding s to the shifted m rather than pushing the bits in. The decoder having information regarding the radix g of the next data to be decoded may be relatively advantageous in Golomb coding by being able to interleave the values of S and E with the residual R. The coding of E may be by any convenient method, for example by a variable length code such as a Huffman or other code, or an arithmetic code, and may be interleaved with the coding of R according to the present invention. The sign S is capable of representation by a single bit and so in many cases it may be coded by employing a single bit. However, if the signs S are unevenly distributed, the interleaved coding may be by some other method, for example arithmetic or run length coding. The coding of E interleaved by the present invention may be by any method and is not to be limited by the examples given here. It may be relatively advantageous in coding by the combinatorial coder by interleaving the coding of the bit counting symbol r with the coding of the symbol s. The coding of r may be by any method including a variable length code such as a Huffman or other code, or by arithmetic coding to give but two examples. The coding of r interleaved by the present invention may be by any method and is not to be limited by the examples given here.

Binary data may be a fixed number of b binary bits, or it may be a variable number of bits such as may be coded by a variable length code. If the number of bits is known and is b, then simply code the bits as a value of $s_t$ in the range 0 to $2^b-1$, using $g_t=2^b$. If the bits arise from a variable length code, then they may be inserted one at a time by using $g_t=2$. If insertion of interleaved binary data into the right end of a message is performed, the bits comprising the interleaved data remain available at the least significant end of the message, and may be recovered or decoded by shifting them out to the right into a decoded value. However as soon as a radix $g_t$ occurs which is not a power of 2, the interleaved data will no longer be separated in the message as a sequence of b bits. In the decoding process, however, if the decoder comes to a radix that is a power of 2, the bits will be available at the right hand end of the message and may be extracted by a decoder by shifting.

The radix coder may be used to code the residual part R of a Golomb code, which may be used with all Golomb Coders, but may be particularly useful if the Golomb base is not a power of 2. Such a method may include coding the s part of a combinatorial code which may be used to code any value of s, but may be particularly useful in the many cases where $_nC_r$ is not a power of 2. However, such a method may also be mixed with the coding of any other data, and is not limited to Golomb coding or Combinatorial Coding but may be applicable to the coding of a wide range of other data types and is not to be taken to be limited to the examples given herein.

It may be desirable to predict the efficiency of a coding process. For example, binary notation may assist the prediction of the efficiency of the coding process including the effect of using a particular length of buffer. Working with '1' as the coded digit, let the probability of occurrence of a '1' be q over both long and short blocks of binary data, i.e. q is stationary. As is well known to practitioners in the field, the theoretical cost, or entropy, of coding of each bit from this data may be expressed as:

$$e_q(1) = -q \log_2(q) - (1-q)\log_2(1-q)$$

The entropy, or theoretical cost of coding each bit by an efficient method may be expressed may be expressed as:

$$e_q(n) = -\sum_{r=0}^{n} p_q(r)\log_2 p_q(r) \text{ bits.}$$

At n=1 this gives the identical result to $e_q(1)$ and with other values of n the theoretical total cost of coding n bits is $ne_q(n)$ bits. In a block of n bits, then, the probability of one particular pattern in which r bits are 1 may be expressed may be expressed as:

$$p_q(r) = q^r(1-q)^{n-r}$$

However $_nC_r$ different patterns of r bits from n might occur. The Combinatorial coder considers the different patterns that might occur. The probability of any of the possible $_nC_r$ patterns of r bits from n is $c_q(n, r) = {_nC_r} p_q(r)$, so that the theoretical cost of using the combinatorial coder may easily be calculated as the cost of selecting a value of r and the cost of sending the selected pattern s. Because each pattern of r bits is equally probable, coding the pattern number s by a perfect method would cost $\log_2 r$ bits. Therefore using the probability of each value of r, the theoretical cost of using the method to code n bits may be expressed as:

$$e_q^*(n) = -\sum_{r=0}^{n} c_q(n, r)\log_2(c_q(n, r)) + \sum_{r=0}^{n} c_q(n, r)\log_2({_nC_r})$$

It may be shown that $$e_q^*(n) = ne_q(n),$$

i.e. that a perfect method of coding r and s will achieve perfect coding of the binary data. The Radix coder is therefore capable of perfect compression performance if q is constant.

The total theoretical pattern cost of a message of N symbols $s_n$ each with radix $g_n$ is:

$$\sum_{n=1}^{N} \log_2 g_n$$

The coded data may be efficiently communicated or stored by the radix coder as one long message. In practice this is possible within one bit of the total theoretical value, simply by sending all the bits necessary to describe the message. For example if the message has a theoretical cost of 465328.67 bits, it would be possible to achieve this in 465329 bits. In a practical application or for convenience a system might increase this further to be an exact number of bytes or words or blocks, but in principle efficiency to the rounded up exact number of bits is achievable. This would be true if the coder and decoder knew in advance the length of the message and the radices to be used. It does not include the cost of sending the radices g, or the cost of sending the length of the message or alternatively of terminating it by some special code. As may be seen from the foregoing description, embodiments of the claimed subject matter may be employed when it may not be convenient or possible to construct or store or communicate or receive or decode a long sequence of values using the radix coder, by teaching how a buffer may be used. However, it is worthwhile to note that the claimed subject matter is not so limited.

Additionally or alternatively, in various embodiments, discussed above, the number of symbols to be decoded in the reverse order to the order in which they were coded may be limited. This LIFO behavior may be limited to the number of values in the buffer, which may vary from buffer to buffer. For example, the number of values in the buffer may vary from buffer to buffer if the radices used are different. Individual buffers may be received and decoded in the order they were coded, which might be called First Buffer In First Buffer Out, or FBIFBO, even though the buffer contents are LIFO.

Turning to a combinatorial coder, a prediction may be made regarding the most efficient number of bits n to code together. Furthermore, a calculation of the overall efficiency of the combinatorial coder may be made, as may be a calculation of an average number of bits unused in a buffer of any size according to the claimed subject matter. Recalling that the first code r of the combinatorial coder is not perfect, and the second code is done by the radix coder, it is possible to work out the theoretical performance of the combinatorial coder and select an optimum value for n. The code of a binary word comprises two parts, the first binary symbol code, or selection code, to select r which specifies the number of occurrences of the binary symbol in the word and the second binary symbol code, or pattern code, to specify s which selects which of the $_nC_r$ patterns of r bits occurs in the word. The radix coder for pattern selection s with radix $g = {_nC_r}$ achieves the theoretical compression or entropy, so the coding of s will be taken as the theoretical cost in this example. The effect of the buffer will then be considered. All values of s from 1 to $_nC_r$ are equally likely, so the number of bits required to code a particular value of s is therefore $\log2(_nC_r)$. The probability of a particular value of r may be expressed as:

$$_nC_p(r) = {_nC_r}q^r(1-q)^{n-r}$$

and so the cost of coding s, i.e. the pattern cost which may be achieved in this example may be expressed as:

$$\sum_{r=0}^{n} {_nC_r}q^r(1-q)^{n-r}\log2(_nC_r)$$

For example if n were 6, applying the above formula shows that the ideal pattern cost would be 2.79 bits, to two places of decimals.

In this example a simple Variable Length Code (VLC) is used for the first code which selects a value of r between 0 and n. In this VLC, which in many cases is equivalent to a Huffman Code, the most probable value of r may be be selected by a single bit, as is known to those skilled in coding of data. Either binary '1' or binary '0' may be used as the terminating bit for the VLC, and in either case the opposite, binary '0' or binary '1' is used prior to the terminating bit. The number of bits including the terminating bit determines the value communicated by the VLC. The cost of selecting the second most probable value of r will be 2 bits, either 10 or 01, and similarly the cost of selecting the third most probable value of r will be three bits, either 110 or 001, and so on. To calculate the cost for a particular value of q, the probabilities of each value of r which are $_nC_rp_q(r) = {_nC_r}q^r(1-q)^{n-r}$ are calculated and sorted into descending order.

| For example, with q = 0.25 and n = 6, the probabilities may be expressed as: | | | | | | | |
| --- | --- | --- | --- | --- | --- | --- | --- |
| r = | 0 | 1 | 2 | 3 | 4 | 5 | 6 |
| Probabilities = | 0.1780 | 0.3560 | 0.2966 | 0.1318 | 0.0330 | 0.0044 | 0.0002 |
| And sorted into descending order these are: | | | | | | | |
| r = | 1 | 2 | 0 | 3 | 4 | 5 | 6 |
| Sorted = | 0.3560 | 0.2966 | 0.1780 | 0.1318 | 0.0330 | 0.0044 | 0.0002 |
| Continuing the current example, the number of bits assigned to each for the VLC is: | | | | | | | |
| r = | 1 | 2 | 0 | 3 | 4 | 5 | 6 |
| Sorted = | 0.3560 | 0.2966 | 0.1780 | 0.1318 | 0.0330 | 0.0044 | 0.0002 |
| VLC Bits = | 1 | 2 | 3 | 4 | 5 | 6 | 7 |

The theoretical cost of the VLC for this case, q=0.25 and +6, is obtained by adding up the corresponding probabilities multiplied by the length of the VLC. This gives:

0.3560+2*0.2966+3*0.1780+4*0.1318+5*0.0330+ 6*0.0044+7*0.0002=2.2034 bits.

The ideal theoretical cost of selecting r may be expressed may be expressed as:

$$\sum_{r=0}^{n} {_nC_r}q^r(1-q)^{n-r}\log2(_nC_rq^r(1-q)^{n-r})$$

When n=6 this is 2.0787 so the VLC selection cost is 6.0% greater than the ideal theoretical cost. However, adding both the first selection cost for r and the second pattern costs gives a practical costs using the VLC of 4.9923 to code 6 bits compared to the theoretical ideal total cost of 4.8677, from which it is seen that in this example the coder is predicted to achieve a compressed number of bits which is 2.6% above the theoretical minimum possible.

By a similar calculation it is seen that for a given probability q it is possible to select the first and second coding methods and the word or block length n to give the predicted compression which is lowest, i.e. closest to the theoretical minimum. It is also possible from these calculations or similar ones to work out the required buffer length to achieve a desired overall coding efficiency. This may be done subject to any other constraint such as limit on n or any other characteristic of the method.

An evaluation of an effect of a finite buffer may be made in one embodiment. In general if a radix $g_t$ occurs, the number of bits theoretically required to communicate a symbol $s_t$ which may take $g_t$ equally probable values is $\log_2(g_t)$. This is an exact number of bits only if $g_t$ is a power of 2. Because in embodiments described herein the buffer is being communicated only partially full when coding a new symbol $s_t$ with a particular radix $g_t$ would cause it to overflow, the average number of bits unused in the buffer when it terminates at a radix $g_t$ is $\log_2(g_t)/2$. This is divided by 2 because if $g_t$ occurs the symbol may fit within the buffer length, or it may exactly fit the buffer length, or it may exceed it by any amount up to $\log_2(g_t)$. All possibilities from 0 to $\log_2(g_t)$ are equally likely so that the average overflow by a symbol of radix $g_t$ is $\log_2(g_t)/2$. Furthermore, if the probability of occurrence $p(g_t)$ of each possible value of $g_t$ is known, one may work out the average size of overflow for any combination of q and n may be expressed as:

$$\text{Average Unused Bits} = \sum_{i=0}^{n} p(g_i)\log_2(g_i)/2$$

This is not dependent on the buffer size. The average percentage of bits unused if coding is done into a buffer of length B may be expressed may be expressed as:

Percent Unused=100*(Average Unused Bits)/B

So that it is possible to work out the efficiency of a buffer of any length B provided the probabilities of the radix g are known.

It is worthwhile to note that embodiments of the radix coder operate with radix g which is not generally a power of 2, and so the data in general does not simply get inserted into previous data as additional bits. If that were the case the buffer may be completely filled by the coder including a final incomplete symbol where necessary. Any buffer sent may always be complete as is well known and widely used in data communication. With radix coding, although sometimes the radix g may be a power of 2, in general, as is the purpose of the radix coder, symbols whose range is not a power of 2 will be mixed with those whose range is a power of 2.

From the above theory, the calculation of the efficiency of the coder using a first VLC coder for r and a second ideal code for pattern selection is shown in the table below for a range of values of q between 0.05 and 0.5. For every q value there is a best value of n as shown. The numbers are the percentage by which the predicted number of bits exceeds the theoretical minimum. It is seen that as q gets smaller, the coding with the best value of n gets closer and closer to the ideal, but this occurs at larger and larger values of n, meaning that very large numbers of patterns may be required if r is not very small. Also shown is the average number of bits unused in a buffer of any length at the optimum value of n.

be considered. With an arithmetic code the results might be predicted theoretically or by simulation. Many methods might be used to form the first and second binary symbol code and if used with an embodiment of the Radix coder the claimed subject matter is not limited to any particular method of forming the first binary symbol code or the second binary symbol code.

From the above example it may be seen that a best or a preferred or otherwise determined value of n may be calculated and more generally several coding methods might also be evaluated and the results noted. From these results for a particular value of q a value of n and/or methods of coding either or both of the first code for r and the second code for might be selected for a data sequence. Following the claimed subject matter herein, the buffer size may also be adjusted to achieve compression which is as close to the theoretical minimum as may be desired, or best or acceptable or otherwise chosen compression.

Embodiments in accordance with claimed subject matter may be applied to coding of data of all types, including non-numeric data, such as symbolic data, for example.

| q = | 0.05 | 0.10 | 0.15 | 0.20 | 0.25 | 0.30 | 0.35 | 0.40 | 0.45 | 0.50 |
|---|---|---|---|---|---|---|---|---|---|---|
| Entropy | 0.29 | 0.47 | 0.61 | 0.72 | 0.81 | 0.88 | 0.93 | 0.97 | 0.99 | 1.00 |
| Best % = | 1.5 | 1.8 | 2.1 | 2.3 | 2.6 | 2.6 | 2.8 | 2.8 | 2.6 | 3.3 |
| at n = | 31 | 15 | 10 | 7 | 6 | 6 | 5 | 6 | 5 | 6 |
| Avg Buffer Cut | | | | | | | | | | |
| Bits | 3.3 | 2.4 | 2.0 | 1.5 | 1.4 | 1.6 | 1.3 | 1.8 | 1.4 | 1.8 |

Using the above information, or a similar calculation based at least in part on the above theory, one may choose a buffer size B to achieve for any probability q any desired overall percentage above the ideal, which must however be greater than the best percentage at a particular value of n. For example if q=0.05, we may see that we may get within 1.5% of the theoretical code length by choosing n=31. However on average 3.3 bits are lost every time we store or communicate the buffer. If we want the overall efficiency of the buffered coder to be within 2.5% of the theoretical limit, then we may allow the average 3.3 unfilled bits in the buffer to be 1% of the buffer size. Therefore with n=31, the buffer may be 330 bits or greater.

In this manner it is seen that the buffer length may be chosen to reduce the unused bits in the buffer to as small a percentage of the total as may be desired. It will be clear to an expert in the field that as the probability q of a binary symbol may alter during a coding task, so the calculation of the best n and effect of buffer length may be carried out adaptively. Provided a coder and decoder are following the same rules in estimating and responding to changes in the statistics of the data, the buffer size may be changed adaptively along with other parameters of the coding process, such as, for example, as described in co-pending U.S. patent application Ser. No. 11/777,230 titled BLOCKING FOR COMBINATORIAL CODING/DECODING FOR ELECTRICAL COMPUTERS AND DIGITAL DATA PROCESSING SYSTEMS, by Donald M. Monro, although this is merely an example embodiment, and the scope of claimed subject matter is not so limited.

The calculations described above may be performed for methods of coding the first code r other than the simple VLC. A Huffman code which is a particular form of VLC may be utilized. Similarly a Golomb code or an arithmetic code may Embodiments may be employed to perform radix coding, although it will, of course, be understood that claimed subject matter is not limited to that application. It is intended that embodiments of claimed subject matter be applied to any one of a number of different types of data coding. Therefore, claimed subject matter is not intended to be limited in terms of the type of data to which it may be applied.

Figure 7:
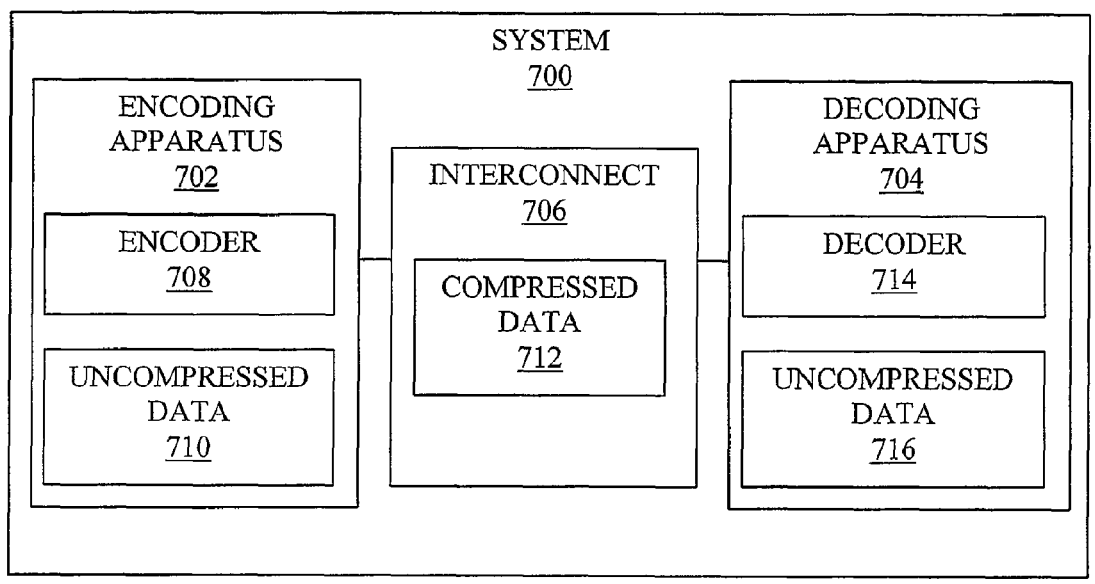
FIG. 7 is a block diagram illustrating an example system and/or an apparatus in accordance with one or more embodiments.

FIG. 7 is a block diagram illustrating an example embodiment of a system 700 comprising an encoding apparatus 702 and a decoding apparatus 704 in accordance with the claimed subject matter. In one embodiment, system 700 may include encoding apparatus 702, decoding apparatus 704 and an interconnect 706. Communication between encoding apparatus 702 and decoding apparatus 704 may performed over interconnect 706. For example, interconnect 706 may permit communication between functional units in a single device, between two dies sharing a package, and/or between two devices in a computing platform, such as is described below in FIG. 8. Alternatively or additionally, interconnect 706 may be may be a network, which permits remote communication between two devices.

In one embodiment, encoding apparatus 702 may include an encoder 708 which may be capable of performing one or more techniques as described above and illustrated in FIGS. 1, 2, 3, 5 and/or 6. In an embodiment, encoder 708 may take uncompressed data 710 and encode it, or a portion of it, into compressed data 712. In one embodiment, encoding apparatus 702 may transmit compressed data 712 to decoding apparatus 704 via interconnect 706.

In one embodiment, decoding apparatus 704 may include a decoder 714, which may be capable of performing the reverse of the technique as described above and illustrated in FIGS. 1, 2, 3, 5 and/or 6. For example, decoder 714 may be capable of performing a decoding technique as described above and illustrated in FIG. 4. Decoder 714 may take compressed data 712 and decode it, or a portion of it, into uncompressed data 716. System 700 described above is not limited to any particular hardware or software configuration and all or part of system 700 may find applicability in any computing or processing environment such as is described below in FIG. 8, for example.

Figure 8:
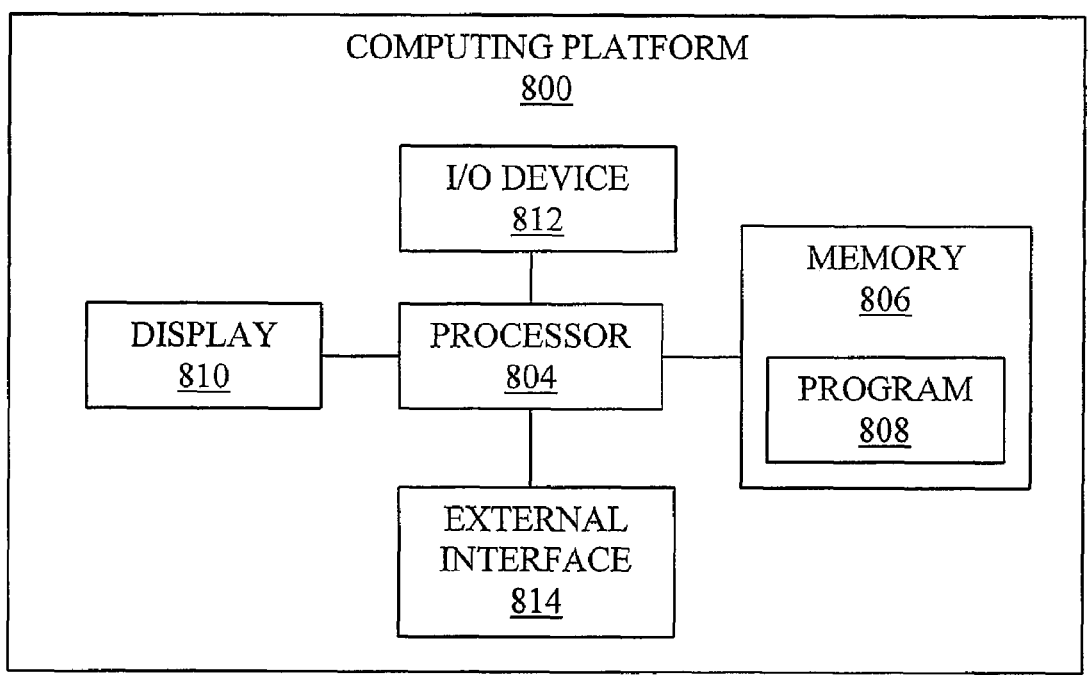
FIG. 8 is a schematic diagram of an example computing platform in accordance with one or more embodiments.

Referring to FIG. 8, a block diagram of an example computing platform 800 according to one or more embodiments is illustrated, although the scope of claimed subject matter is not limited in this respect. Computing platform 800 may include more and/or fewer components than those shown in FIG. 8. However, generally conventional components may not be shown, for example, a battery, a bus, and so on.

Computing platform 800, as shown in FIG. 8 may be utilized to embody tangibly a computer program and/or graphical user interface by providing hardware components on which the computer program and/or graphical user interface may be executed. Computing platform 800 may be utilized to embody tangibly all or a portion of procedure embodiment 600 of FIG. 6 and/or other procedures disclosed herein. Such a procedure, computer program and/or machine readable instructions may be stored tangibly on a computer and/or machine readable storage medium such as a compact disk (CD), digital versatile disk (DVD), flash memory device, hard disk drive (HDD), and so on. As shown in FIG. 8, computing platform 800 may be controlled by processor 804, including one or more auxiliary processors (not shown). Processor 804 may comprise a central processing unit such as a microprocessor or microcontroller for executing programs, performing data manipulations, and controlling the tasks of computing platform 800. Auxiliary processors may manage input/output, perform floating point mathematical operations, manage digital signals, perform fast execution of signal processing algorithms, operate as a back-end processor and/or a slave-type processor subordinate to processor 804, operate as an additional microprocessor and/or controller for dual and/or multiple processor systems, and/or operate as a coprocessor and/or additional processor. Such auxiliary processors may be discrete processors and/or may be arranged in the same package as processor 804, for example, in a multicore and/or multithreaded processor; however, the scope of the scope of claimed subject matter is not limited in these respects.

Communication with processor 804 may be implemented via a bus (not shown) for transferring information among the components of computing platform 800. A bus may include a data channel for facilitating information transfer between storage and other peripheral components of computing platform 800. A bus further may provide a set of signals utilized for communication with processor 804, including, for example, a data bus, an address bus, and/or a control bus. A bus may comprise any bus architecture according to promulgated standards, for example, industry standard architecture (ISA), extended industry standard architecture (EISA), micro channel architecture (MCA), Video Electronics Standards Association local bus (VLB), peripheral component interconnect (PCI) local bus, PCI express (PCIe), hyper transport (HT), standards promulgated by the Institute of Electrical and Electronics Engineers (IEEE) including IEEE 488 general-purpose interface bus (GPIB), IEEE 696/S-100, and so on, although the scope of the scope of claimed subject matter is not limited in this respect.

Other components of computing platform 800 may include, for example, memory 806, including one or more auxiliary memories (not shown). Memory 806 may provide storage of instructions and data for one or more programs 808 to be executed by processor 804, such as all or a portion of procedure embodiment 600 of FIG. 6 and/or other procedures disclosed herein, for example. Memory 806 may be, for example, semiconductor-based memory such as dynamic random access memory (DRAM) and/or static random access memory (SRAM), and/or the like. Other semi-conductor-based memory types may include, for example, synchronous dynamic random access memory (SDRAM), Rambus dynamic random access memory (RDRAM), ferroelectric random access memory (FRAM), and so on. Alternatively or additionally, memory 806 may be, for example, magnetic-based memory, such as a magnetic disc memory, a magnetic tape memory, and/or the like; an optical-based memory, such as a compact disc read write memory, and/or the like; a magneto-optical-based memory, such as a memory formed of ferromagnetic material read by a laser, and/or the like; a phase-change-based memory such as phase change memory (PRAM), and/or the like; a holographic-based memory such as rewritable holographic storage utilizing the photorefractive effect in crystals, and/or the like; and/or a molecular-based memory such as polymer-based memories, and/or the like. Auxiliary memories may be utilized to store instructions and/or data that are to be loaded into memory 806 before execution. Auxiliary memories may include semiconductor based memory such as read-only memory (ROM), programmable read-only memory (PROM), erasable programmable read-only memory (EPROM), electrically erasable read-only memory (EEPROM), and/or flash memory, and/or any block oriented memory similar to EEPROM. Auxiliary memories also may include any type of non-semiconductor-based memories, including, but not limited to, magnetic tape, drum, floppy disk, hard disk, optical, laser disk, compact disc read-only memory (CD-ROM), write once compact disc (CD-R), rewritable compact disc (CD-RW), digital versatile disc read-only memory (DVD-ROM), write once DVD (DVD-R), rewritable digital versatile disc (DVD-RAM), and so on. Other varieties of memory devices are contemplated as well.

Computing platform 800 further may include a display 810. Display 810 may comprise a video display adapter having components, including, for example, video memory, a buffer, and/or a graphics engine. Such video memory may be, for example, video random access memory (VRAM), synchronous graphics random access memory (SGRAM), windows random access memory (WRAM), and/or the like. Display 810 may comprise a cathode ray-tube (CRT) type display such as a monitor and/or television, and/or may comprise an alternative type of display technology such as a projection type CRT type display, a liquid-crystal display (LCD) projector type display, an LCD type display, a light-emitting diode (LED) type display, a gas and/or plasma type display, an electroluminescent type display, a vacuum fluorescent type display, a cathodoluminescent and/or field emission type display, a plasma addressed liquid crystal (PALC) type display, a high gain emissive display (HGED) type display, and so forth.

Computing platform 800 further may include one or more I/O devices 812. I/O device 812 may comprise one or more I/O devices 812 such as a keyboard, mouse, trackball, touchpad, joystick, track stick, infrared transducers, printer, modem, RF modem, bar code reader, charge-coupled device (CCD) reader, scanner, compact disc (CD), compact disc read-only memory (CD-ROM), digital versatile disc (DVD), video capture device, TV tuner card, touch screen, stylus, electroacoustic transducer, microphone, speaker, audio amplifier, and/or the like.

Computing platform 800 further may include an external interface 814. External interface 814 may comprise one or more controllers and/or adapters to prove interface functions between multiple I/O devices 812. For example, external interface 814 may comprise a serial port, parallel port, universal serial bus (USB) port, and IEEE 1394 serial bus port, infrared port, network adapter, printer adapter, radio-frequency (RF) communications adapter, universal asynchronous receiver-transmitter (UART) port, and/or the like, to interface between corresponding I/O devices 812. External interface 814 for an embodiment may comprise a network controller capable of providing an interface, directly or indirectly, to a network, such as, for example, the Internet.

It is noted, of course, that claimed subject matter is not limited to particular embodiments. Therefore, in addition to covering methods for coding and/or decoding of data, claimed subject matter is also intended to cover, for example, software incorporating such methods and to coders and/or decoders (whether implemented in hardware or software, or a combination of hardware and software). Claimed subject matter is also intended to include a video or audio codec embodying such methods and/or a video or audio compression system whereby data may be encoded according to a method as described or claimed. For example, embodiments may include transmitting data across a communications channel for reconstruction be a decoder at the far end. Likewise, alternatively, in another embodiment in accordance with claimed subject matter coded data may be stored rather than transmitted. Thus, claimed subject matter is intended to cover these as well as other embodiments.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

What is claimed is:

1. An apparatus comprising:
   a buffer; and
   a processor operatively coupled to the buffer and configured to:
   determine a number of discrete values resulting from coding a data symbol into the buffer based at least in part on a radix of the data symbol;
   compare the number of discrete values with a buffer capacity of the buffer;
   scale the buffer based at least in part on the radix of the data symbol if the number of discrete values does not exceed the buffer capacity of the buffer; and
   code the data symbol into the scaled buffer if the number of discrete values does not exceed the buffer capacity of the buffer.

2. The apparatus of claim 1, further comprising a transmitter configured to transmit contents of the buffer to a decoder.

3. The apparatus of claim 2, wherein the processor is further configured to:
   initialize the buffer to zero; and
   code a second data symbol into the initialized buffer, wherein the data symbol and the second data symbol are part of a sequence of data symbols.

4. The apparatus of claim 2, wherein the transmitter is further configured to transmit a length of the buffer to the decoder.

5. The apparatus of claim 1, wherein the number of discrete values is determined based at least in part on a comparison of the radix of the data symbol with an accumulated radix of previously coded data symbols.

6. A method comprising:
   receiving, at a decoding device, first contents of a buffer, wherein the first contents of the buffer include at least a first data symbol, and wherein the first data symbol is coded into the first contents of the buffer based at least in part on a first radix of the first data symbol;
   decoding the first data symbol from the first contents of the buffer;
   determining, based at least in part on the first radix of the first data symbol, whether the first contents of the buffer include a second data symbol; and
   decoding the second data symbol from the first contents of the buffer if the first contents include the second data symbol.

7. The method of claim 6, further comprising decoding the second data symbol from second contents of the buffer if the first contents of the buffer do not include the second data symbol.

8. The method of claim 7, further comprising receiving the second contents of the buffer from a coding device.

9. The method of claim 7, further comprising determining, based at least in part on a second radix of the second data symbol, whether the second contents of the buffer include a third data symbol.

10. The method of claim 6, wherein determining whether the first contents of the buffer include the second data symbol includes:
    multiplying the first radix by a second radix of the second data symbol to obtain a product; and
    comparing the product to a capacity associated with the buffer.

11. The method of claim 10, further comprising receiving the capacity of the buffer from a coding device.

12. The method of claim 6, wherein, if the first contents of the buffer include the second data symbol, the first data symbol was coded into the first contents of the buffer after the second data symbol was coded into the first contents of the buffer.

13. An apparatus comprising:
    a receiver configured to receive first contents of a buffer, wherein the first contents of the buffer include at least a first data symbol, and wherein the first data symbol is coded into the first contents of the buffer based at least in part on a first radix of the first data symbol; and
    a processor operatively coupled to the receiver and configured to:
    decode the first data symbol from the first contents of the buffer;
    determine, based at least in part on the first radix of the first data symbol, whether the first contents of the buffer include a second data symbol; and
    decode the second data symbol from the first contents of the buffer if the first contents include the second data symbol.

14. The apparatus of claim 13, wherein the receiver is further configured to receive a length of the buffer from a coding device, and wherein the determination of whether the first contents of the buffer include the second data symbol is based at least in part on the length of the buffer.

15. The apparatus of claim 13, wherein the processor is further configured to determine the first radix of the first data symbol and a second radix of the second data symbol.

16. The apparatus of claim 13, wherein:
the receiver is further configured to receive second contents of the buffer; and
the processor is further configured to decode the second data symbol from second contents of the buffer if the first contents of the buffer do not include the second data symbol.

17. The apparatus of claim 13, wherein a capacity of the buffer is determined by a coding device based at least in part on the first radix and a second radix of the second data symbol.

18. An apparatus comprising:
means for receiving first contents of a buffer, wherein the first contents of the buffer include at least a first data symbol, and wherein the first data symbol is coded into the first contents of the buffer based at least in part on a first radix of the first data symbol;
means for decoding the first data symbol from the first contents of the buffer;
means for determining, based at least in part on the first radix of the first data symbol, whether the first contents of the buffer include a second data symbol; and
means for decoding the second data symbol from second contents of the buffer if the first contents of the buffer do not include the second data symbol.

19. The apparatus of claim 18, further comprising means for decoding the second data symbol from the first contents of the buffer if the first contents include the second data symbol.

20. The apparatus of claim 18, further comprising:
means for multiplying the first radix by a second radix of the second data symbol to obtain a product; and
means for comparing the product to a capacity associated with the buffer to determine whether the first contents of the buffer include the second data symbol.

21. The apparatus of claim 18, wherein the first data symbol is decoded from the first contents of the buffer based at least in part on the first radix.

22. The apparatus of claim 18, further comprising means for determining the first radix of the first data symbol.

23. A tangible computer-readable medium having stored thereon, computer-executable instructions that, if executed by a decoding device, cause the decoding device to perform a method comprising:
receiving first contents of a buffer, wherein the first contents of the buffer include at least a first data symbol, and wherein the first data symbol is coded into the first contents of the buffer based at least in part on a first radix of the first data symbol;
decoding the first data symbol from the first contents of the buffer;
determining, based at least in part on the first radix of the first data symbol, whether the first contents of the buffer include a second data symbol; and
decoding the second data symbol from second contents of the buffer if the first contents of the buffer do not include the second data symbol.

24. The tangible computer-readable medium of claim 23, further comprising decoding the second data symbol from the first contents of the buffer if the first contents include the second data symbol.

25. The tangible computer-readable medium of claim 23, wherein the first data symbol corresponds to a pattern of a binary symbol code.

26. The tangible computer-readable medium of claim 23, further comprising determining the first radix and a second radix of the second data symbol, wherein the first radix is different than the second radix.

27. The tangible computer-readable medium of claim 23, further comprising receiving a capacity of the buffer, wherein the determination of whether the first contents of the buffer include the second data symbol is based at least in part on the capacity of the buffer.

\* \* \* \* \*

UNITED STATES PATENT AND TRADEMARK OFFICE
CERTIFICATE OF CORRECTION

| | |
|---|---|
| PATENT NO. | : 7,843,367 B2 |
| APPLICATION NO. | : 12/463584 |
| DATED | : November 30, 2010 |
| INVENTOR(S) | : Monro |

It is certified that error appears in the above-identified patent and that said Letters Patent is hereby corrected as shown below:

Title page, item (76), under "Inventor", in Column 1, Lines 1-2,
delete "Donald M. Monro, 6, the Lays, Goose Street, Beckington BA11 6RS (GB)" and
insert -- Donald Martin Monro, 6, The Lays, Goose Street, Beckington, Somerset BA11 6RS (GB) --.

Title page, item (56), under "Other Publications", in Column 2, Line 1, delete "Birate" and
insert -- Bitrate --.

Sheet 1 of 8, Figure 1, Line 1, delete "2E" and insert -- $2^E$ --.

Sheet 1 of 8, Figure 1, Line 3 (approx.), delete "SIGNIFCANT" and insert -- SIGNIFICANT --.

Column 4, line 13, delete "referrea" and insert -- referred --.

Column 6, line 42, delete "Monro,;" and insert -- Monro; --.

Column 6, line 56, delete "11/77,081" and insert -- 11/777,081 --.

Column 7, line 57, delete "$log_2$ (g)" and insert -- $log_2(g)$ --.

Column 8, line 1, delete "$log_2$ (11)=3.46" and insert -- $log_2(11)=3.46$ --.

Column 8, line 15, delete "Inf" and insert -- Info --.

Column 8, line 38, delete "fix ($log_k$(M))," and insert -- fix($log_k$(M)), --.

Column 9, line 30, delete "fix($log_2$ M)" and insert -- fix($log_2$M) --.

Column 10, line 3, delete "Monro,;" and insert -- Monro; --.

Signed and Sealed this
Nineteenth Day of April, 2011

David J. Kappos
*Director of the United States Patent and Trademark Office*

CERTIFICATE OF CORRECTION (continued)
U.S. Pat. No. 7,843,367 B2

Column 11, line 39, delete "Monro,;" and insert -- Monro; --.

Column 13, line 5, delete "Occurances" and insert -- Occurrences --.

Column 13, line 55, delete "$m_0$." and insert -- $m_0$ --.

Column 14, line 5, delete "$m_t$-1," and insert -- $m_{t-1}$, --.

Column 14, line 18, delete "multiradix" and insert -- multi-radix --.

Column 14, line 35, delete "$g^t$" and insert -- $g_t$ --.

Column 17, line 19, delete "$s_1 l$" and insert -- $s_1$ --.

Column 20, line 12, delete "$g_{v-1}$" and insert -- $s_{v-1}$ --.

Column 21, line 34, Delete "$e_q(1)=-q\ log_2(q)-(1-q)log_2(1-q)$" and insert -- $e_q(1)=-qlog_2(q)-(1-q)log_2(1-q)$ --.

Column 21, line 47, delete "1" and insert -- '1' --.

Column 21, line 52, delete "Combinatorial" and insert -- combinatorial --.

Column 21, line 59, delete "$log_2\ r$" and insert -- $log_2 r$ --.

Column 21, line 65, delete "log2" and insert -- $log_2$ --.

Column 22, line 57, delete "code is" and insert -- code s is --.

Column 23, line 3, delete "$log2(_nC_r)$." and insert -- $log_2(_nC_r)$. --.

Column 23, line 5, delete "$_nC_p(r)=_nC_r q^r(1-q)^{n-r}$" and insert -- $_nC_r p_q(r)=_nC_r q^r(1-q)^{n-r}$ --.

Column 23, line 12, delete "log2" and insert -- $log_2$ --.

Column 23, line 22, delete "be be" and insert -- be --.

Column 23, line 63, delete "log2" and insert -- $log_2$ --.

Column 24, line 26, delete "g," and insert -- $g_t$ --.

Column 24, line 54, delete "$p(g_i)log_2(g_i)/2$" and insert -- $p(g_t)log_2(g_t)/2$ --.

Column 26, lines 13-14, delete "for might" and insert -- for s might --.

Column 28, line 26, delete "erasable read" and insert -- erasable programmable read --.